(12) United States Patent
Kwak et al.

(10) Patent No.: US 10,679,702 B2
(45) Date of Patent: Jun. 9, 2020

(54) MEMORY DEVICE WITH VOLTAGE CONTROLLER

(71) Applicant: Samsung Electronics Co., Ltd., Suwon-si, Gyeonggi-do (KR)

(72) Inventors: Dong Hun Kwak, Hwaseong-si (KR); Sang Wan Nam, Hwaseong-si (KR); Chi Weon Yoon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/125,905

(22) Filed: Sep. 10, 2018

(65) Prior Publication Data

US 2019/0259456 A1 Aug. 22, 2019

(30) Foreign Application Priority Data

Feb. 22, 2018 (KR) .................. 10-2018-0020979

(51) Int. Cl.
| | |
|---|---|
| *G11C 16/10* | (2006.01) |
| *H01L 27/11556* | (2017.01) |
| *G11C 16/26* | (2006.01) |
| *G11C 16/04* | (2006.01) |
| *H01L 27/11582* | (2017.01) |

(52) U.S. Cl.
CPC .......... *G11C 16/10* (2013.01); *G11C 16/0483* (2013.01); *G11C 16/26* (2013.01); *H01L 27/11556* (2013.01); *H01L 27/11582* (2013.01)

(58) Field of Classification Search
CPC ..... G11C 16/10; G11C 16/0483; G11C 16/26; H01L 27/11582; H01L 27/11556
See application file for complete search history.

(56) References Cited

U.S. PATENT DOCUMENTS

| | | | |
|---|---|---|---|
| 9,105,335 B2 | 8/2015 | Maejima et al. | |
| 9,183,934 B2 | 11/2015 | Yano | |
| 9,183,939 B2 | 11/2015 | Nam et al. | |
| 9,349,471 B2 | 5/2016 | Yun | |
| 9,355,724 B2 | 5/2016 | Oh et al. | |
| 9,449,700 B2 | 9/2016 | Shah et al. | |
| 9,570,176 B2 | 2/2017 | Jung et al. | |
| 9,653,172 B2 | 5/2017 | Lee | |
| 9,672,918 B2 * | 6/2017 | Hashimoto | ............ G11C 16/08 |
| 2013/0336061 A1 * | 12/2013 | Kim | .................. G11C 16/0483 365/185.11 |
| 2018/0294031 A1 * | 10/2018 | Seo | ........................ G11C 16/10 |

* cited by examiner

*Primary Examiner* — David Lam
(74) *Attorney, Agent, or Firm* — Harness, Dickey and Pierce, P.L.C.

(57) ABSTRACT

A memory device includes a first memory area, a second memory area, a third memory area and a controller. The first memory area has a plurality of first memory cells sharing a first channel area. The second memory area has a plurality of second memory cells sharing the first channel area. The third memory area having a plurality of third memory cells sharing a second channel area, the second channel area being different from the first channel area, the first channel area and the second channel area being connected to a bit line. The controller is configured to input a voltage for the second memory cells to the second memory cells and a voltage for the third memory cells to the third memory cells, when a controlling operation is performed on the first memory cells, the voltages for the second and third memory cells having different magnitudes.

20 Claims, 17 Drawing Sheets

MEMORY DEVICE WITH VOLTAGE CONTROLLER

CROSS-REFERENCE TO RELATED APPLICATION(S)

This application claims benefit of priority to Korean Patent Application No. 10-2018-0020979 filed on Feb. 22, 2018 in the Korean Intellectual Property Office, the disclosure of which is incorporated herein by reference in its entirety.

BACKGROUND

1. Field

The present inventive concepts relate to a memory device.

2. Description of Related Art

As demand for memory devices having high capacity while having a small size increases, research into a memory device having vertically stacked memory cells has been actively conducted. Recently, as a degree of integration of a memory device increases and the number of memory cells, vertically stacked, increases, various methods for dividing a plurality of memory cells into a plurality of memory areas to be controlled have been proposed.

SUMMARY

Some example embodiments of the present inventive concepts may relate to a memory device capable of significantly reducing an effect of a controlling operation on remaining memory areas, of a plurality of memory areas, when the controlling operation is performed on one of the plurality of memory areas.

According to some example embodiments of the present inventive concepts, a memory device includes a first memory area, a second memory area, a third memory area and a controller. The first memory area has a plurality of first memory cells sharing a first channel area. The second memory area has a plurality of second memory cells sharing the first channel area. The third memory area having a plurality of third memory cells sharing a second channel area, the second channel area being different from the first channel area, the first channel area and the second channel area being connected to a bit line. The controller is configured to input a voltage for the second memory cells to the second memory cells and a voltage for the third memory cells to the third memory cells, when a controlling operation is performed on at least one of the first memory cells, the voltages for the second and third memory cells having different magnitudes.

According to some example embodiments of the present inventive concepts, a memory device includes a memory cell array, and a controller. The memory cell array includes a first memory area and a second memory area. The first memory area includes a plurality of first memory cell. The second memory area includes a plurality of second memory cells. The first memory area and the second memory area are connected to a bit line. The controller is configured to input an operating voltage to a selected memory cell among the plurality of first memory cells, and input a pass voltage, different from the operating voltage, to remaining non-selected memory cells among the plurality of first memory cells, to perform a controlling operation on the first memory area. The controller is configured to determine a second voltage to be input to the plurality of second memory cells, based on at least one of whether the second memory area is programmed and whether the first memory area and the second memory area share a channel area.

According to some example embodiments of the present inventive concepts, a memory device includes: a memory device includes a memory cell array and a controller. The memory cell array includes a first memory area, a second memory area, and a third memory area. The second memory area is configured to store data and is different from the first memory area. The third memory area is not configured to store the data and is different from the first memory area and the second memory area, the first memory area, the second memory area, and the third memory area being connected to a bit line. The controller is configured to input a second voltage to the second memory area and input a third voltage to the third memory area, when a plurality of first voltages are input to the first memory area to perform a controlling operation for the first memory area and discharge the second voltage and the third voltage when the controlling operation is terminated.

BRIEF DESCRIPTION OF DRAWINGS

The above and other features and other advantages of the present disclosure will be more clearly understood from the following detailed description, taken in conjunction with the accompanying drawings, in which.

DETAILED DESCRIPTION

Hereinafter, example embodiments of the present disclosure will be described in detail with reference to the accompanying drawings.

Figure 1:
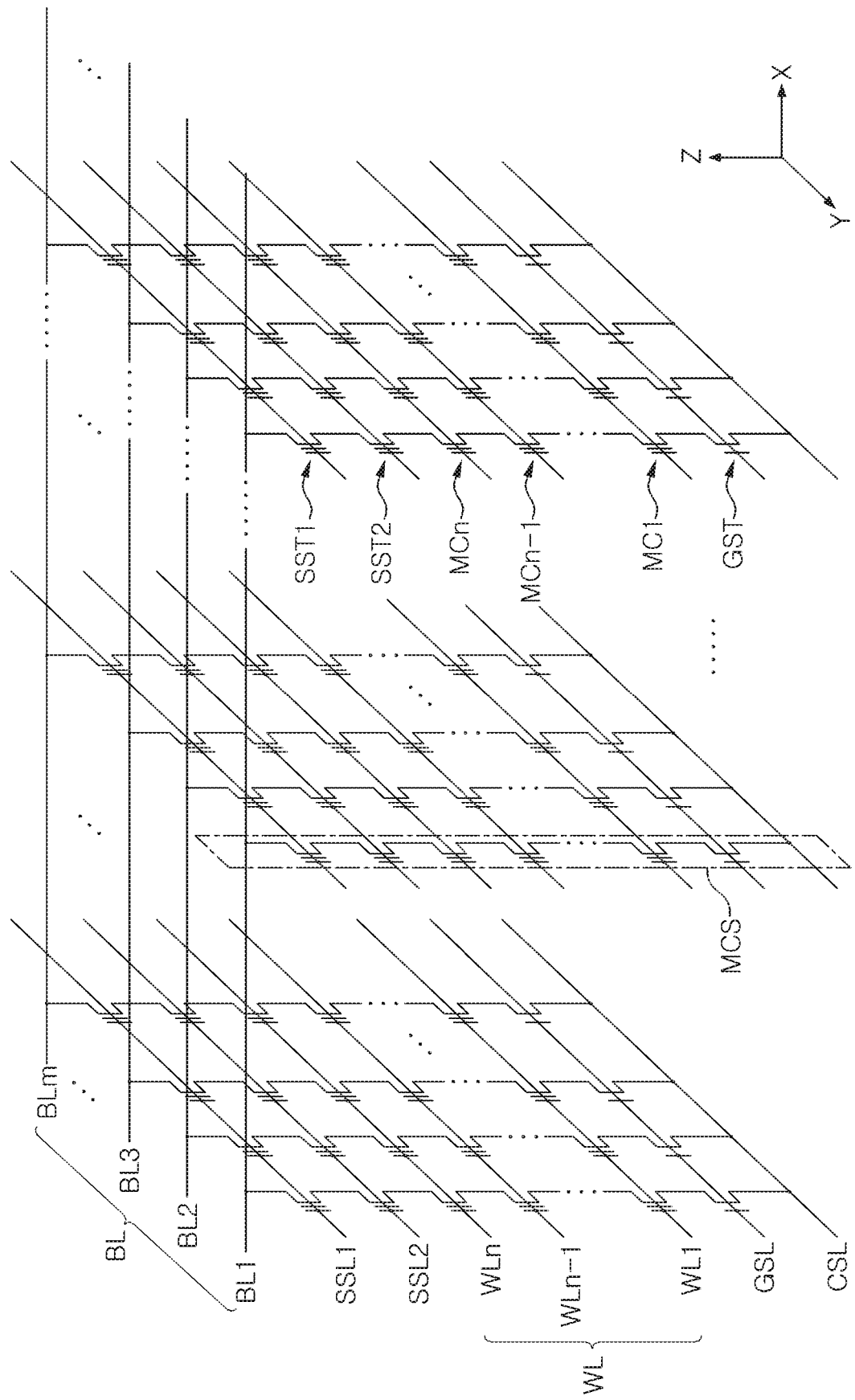
FIG. 1 is a view illustrating a memory cell array included in a memory device according to some example embodiments.

FIG. 1 is a view illustrating a memory cell array included in a memory device according to some example embodiments.

Referring to FIG. 1, a memory cell array may include a plurality of memory cells MC according to some example embodiments. Respective memory cells MC may be provided at respective points at which a plurality of word lines WL and a plurality of bit lines BL intersect each other. In other words, each memory cell MC may be connected to one among the plurality of word lines WL and one among the plurality of bit lines BL.

The plurality of memory cells MC may be connected to each other in series and may provide a single memory cell string MCS. The memory cell string MCS may further include a string select transistor SST and a ground select transistor GST, in addition to the memory cells MC. The string select transistor SST may be connected to one of the bit lines BL above the memory cells MC in the memory cell string MCS. The ground select transistor GST may be connected to a common source line CSL below the memory cells MC.

In an example embodiment, the memory cells MC, included in a memory cell array, may be divided into a plurality of memory areas to be operated. The plurality of memory areas may be areas, virtually divided by a controller controlling a memory cell array. In other words, the plurality of memory areas may be areas, which are not physically separated. For example, the plurality of memory cells MC, connected to one among the plurality of bit lines BL, may be divided into different memory areas.

Figure 2:
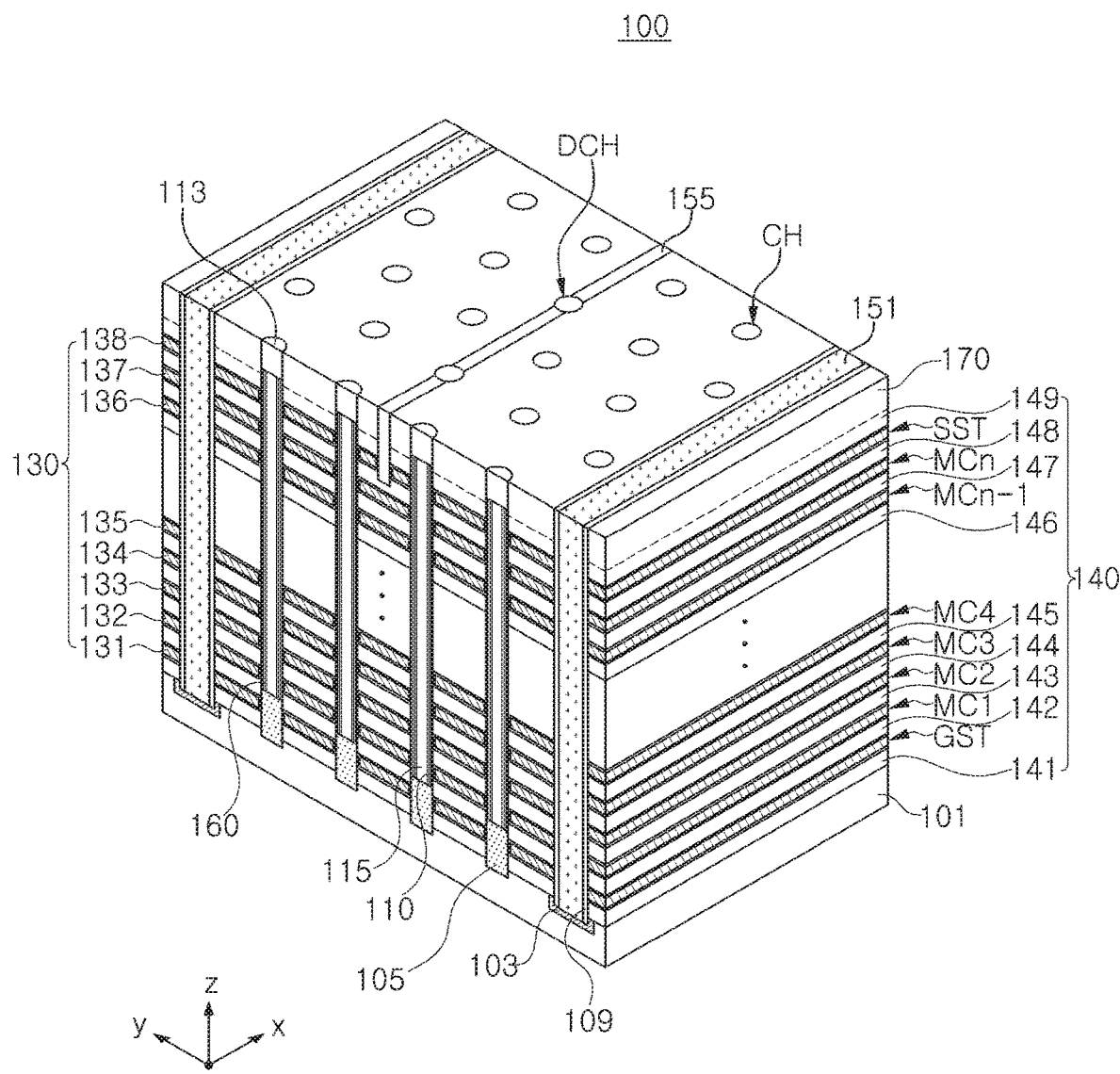
FIGS. 2 to 4 are schematic views illustrating a structure of a memory device according to various example embodiments.
Figure 3:
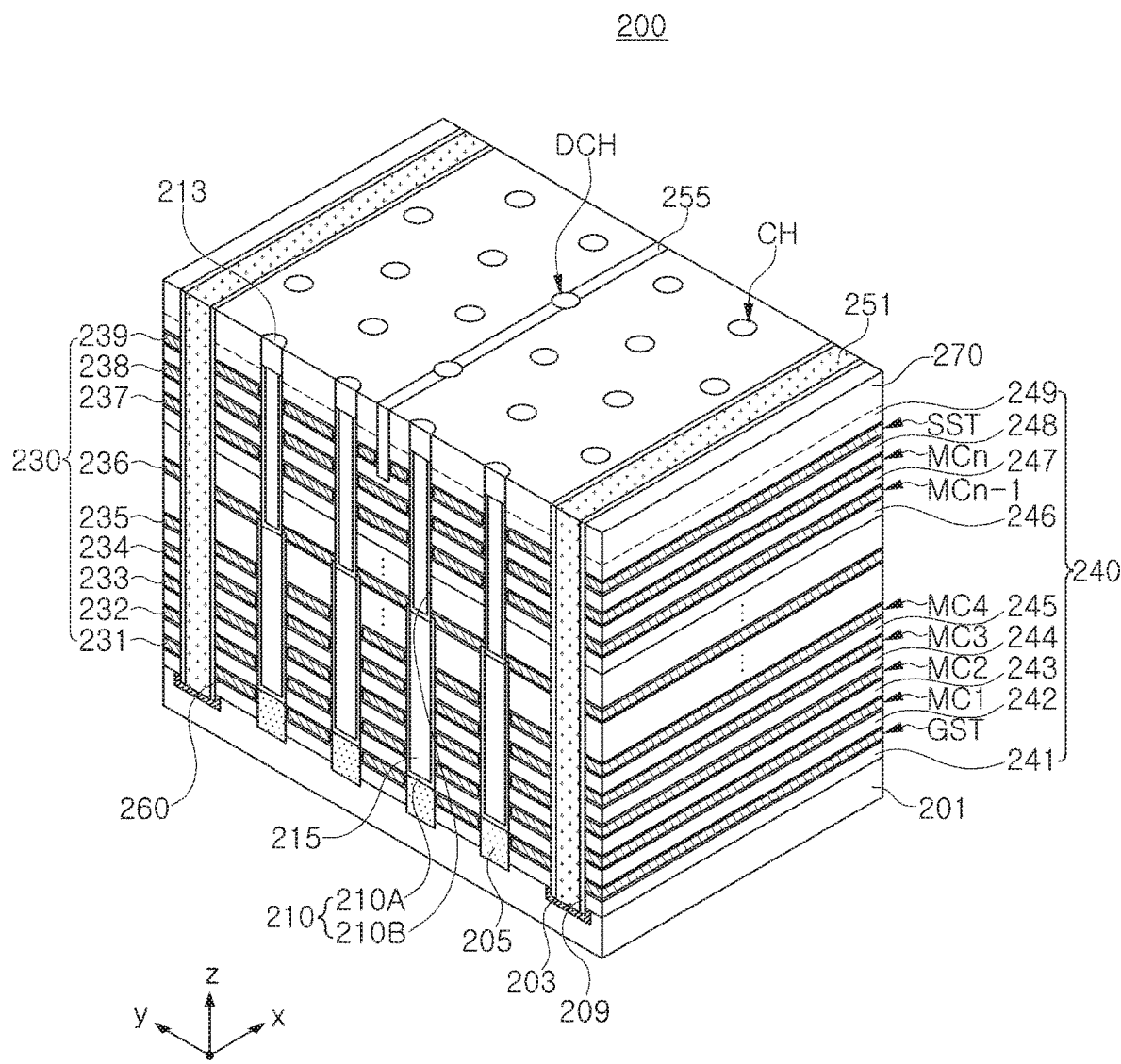
Figure 4:
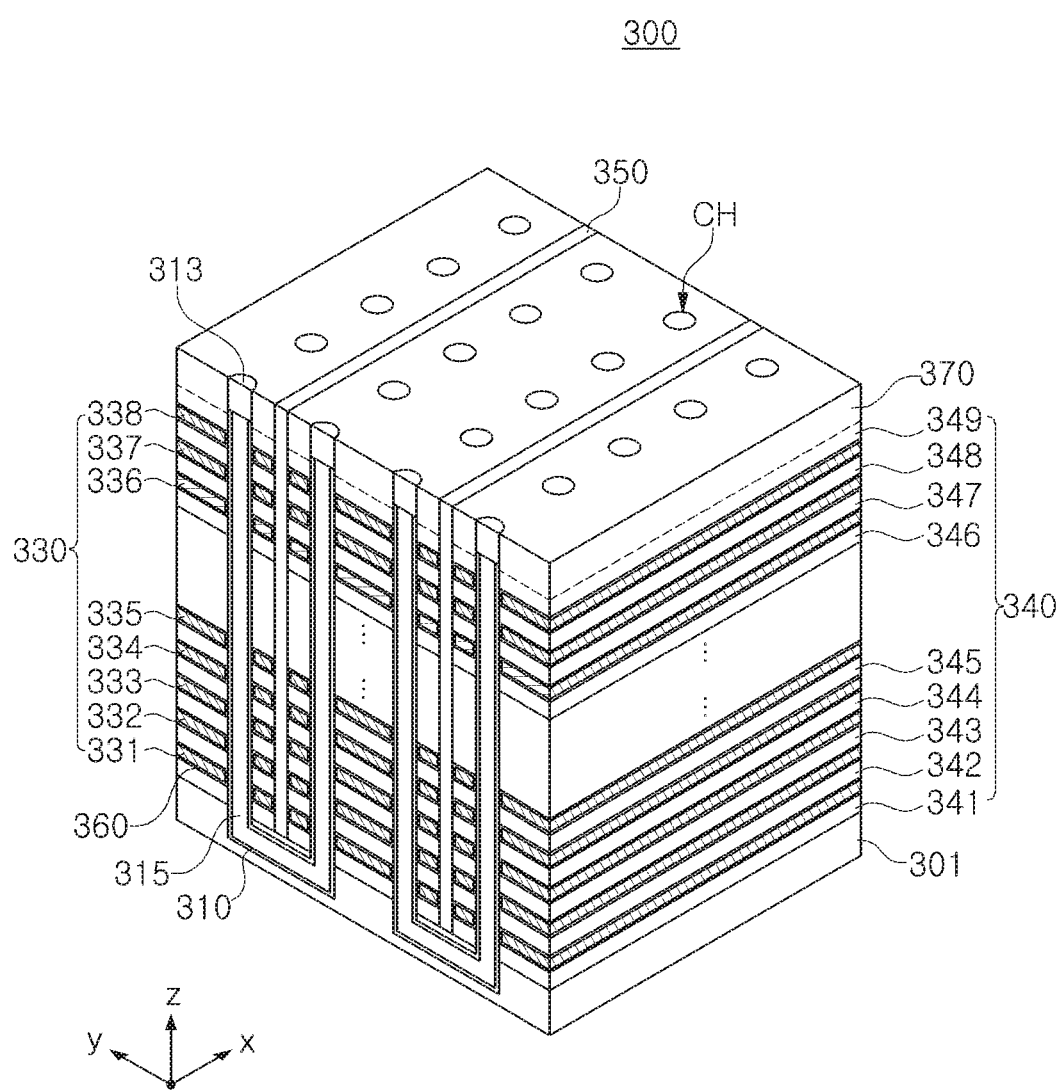

FIGS. 2 to 4 are schematic views illustrating a structure of a memory device according to various example embodiments.

FIG. 2 is a perspective view illustrating a portion of a memory cell array included in a memory device 100. Referring to FIG. 2, the memory device 100 according to some example embodiments may include a substrate 101, a plurality of channel structures CH and dummy channel structures DCH, perpendicular to an upper surface (an X-Y plane of some example embodiments illustrated in FIG. 2) of the substrate 101, a plurality of gate electrode layers 130 (e.g., gate electrode layers 131 to 138), stacked on the substrate 101 to be adjacent to the channel structure CH, and the like. The plurality of gate electrode layers 130 may be alternately stacked with a plurality of insulating layers 140 (e.g., insulating layers 141 to 149), and at least a portion among the plurality of gate electrode layers 130 may be divided into a plurality of pieces by a separation insulating layer 155.

The plurality of gate electrode layers 130 may provide a ground select line 131 and a string select line 138 as well as a plurality of word lines 132 to 137. Each of the ground select line 131 and the string select line 138 may provide the ground select transistor GST and the string select transistor SST, with the channel structure CH. The plurality of word lines 132 to 137 are disposed between the ground select line 131 and the string select line 138, and may provide a plurality of memory cells MC1 to MCn, with the channel structure CH.

The plurality of gate electrode layers 130 may be divided into a plurality of pieces by a common source line 151 and a spacer 109 on a side surface of the common source line 151. The common source line 151 may be formed of a metal, a metal compound, or an insulating material such as polysilicon, and may be electrically connected to the source region 103 formed on the substrate 101. The source region 103 may be provided as a source region of the ground select transistor GST. The common source line 151 may be electrically isolated from the plurality of gate electrode layers 130 by the spacer 109.

The plurality of channel structures CH and dummy channel structures DCH may be extended in a direction (a Z-axis direction in some example embodiments in FIG. 2) perpendicular to an upper surface of the substrate 101. Each channel structure CH may include a channel area 110, an embedded insulating layer 115 filling an inner space of the channel area 110, a drain region 113 provided above the channel area 110, a gate insulating layer 160 provided between the channel area 110 and the gate electrode layers 130, and the like. The gate insulating layer 160 may include a tunneling layer, a charge storage layer, a blocking layer, and the like, and at least a portion of the gate insulating layer 160 may be provided in the form of surrounding the gate electrode layers 130. The channel area 110 may have a columnar shape such as a cylinder or a prism without the embedded insulating layer 115 according to some example embodiments. Moreover, each channel structure CH may have an inclined side surface, narrower toward the substrate 101 depending on an aspect ratio thereof.

The plurality of channel structures CH and dummy channel structures DCH may be disposed to be separated from each other on an X-Y plane. The number and arrangement of the plurality of channel structures CH and dummy channel structures DCH may vary according to an example embodiment. For example, the plurality of channel structures CH and dummy channel structures DCH may be disposed in zig-zag form in at least one direction. In an example embodiment illustrated in FIG. 2, the plurality of channel structures CH are symmetrically arranged with a separation insulating layer 155 interposed therebetween, and the plurality of dummy channel structures DCH are illustrated to pass through the separation insulating layer 155, but are not limited thereto. Each among the plurality of channel structures CH may be connected to a bit line disposed above the channel structures, and two or more channel structures CH may be connected to a single bit line. For example, in an example embodiment illustrated in FIG. 2, at least a portion among the plurality of channel structures CH, disposed in the same position in an X-axis direction, may be connected to a single bit line.

The channel area 110 may be electrically connected to the substrate 101 through an epitaxial layer 105 in a lower portion thereof. The channel area 110 may include a semiconductor material such as polysilicon or single crystal silicon, and the semiconductor material may be a material not doped with an impurity, or may include a P-type or N-type impurity. The epitaxial layer 105 may be a layer grown using a selective epitaxy growth (SEG) process. The epitaxial layer 105 may be provided in the form in which the epitaxial layer is embedded in the substrate 101 at a predetermined depth as illustrated in FIG. 2.

The plurality of dummy channel structures DCH may have a structure similar to that of the channel structure CH. In other words, each among the plurality of dummy channel structures DCH may include a drain region 113, a channel area 110, and an embedded insulating layer 115, and may selectively include an epitaxial layer 111. However, the plurality of dummy channel structures DCH may be electrically isolated from a bit line in an upper portion of the gate structure, in a manner different from the channel structure CH. Thus, in memory cells MC1 to MCn, provided by the dummy channel structure DCH, some controlling operations, for example, a programming operation may not be executed.

In the memory device 100 according to an example embodiment illustrated in FIG. 2, the plurality of memory cells MC may be divided into a plurality of memory areas. The plurality of memory areas may be an area, virtually defined by a controller configured to perform operations such as programming, reading, deleting, and the like, with respect to the plurality of memory cells MC. For example, a portion among the plurality of memory cells MC, sharing a single channel area 110, is defined as a first memory area, and a remaining portion may be defined as a second memory area.

FIG. 3 is a perspective view illustrating a portion of a memory cell array included in a memory device 200. Referring to FIG. 3, the memory device 200 according to some example embodiments may include a substrate 201, a plurality of channel structures CH and dummy channel structures DCH, perpendicular to an upper surface (an X-Y plane of an example embodiment illustrated in FIG. 3) of the substrate 201, a plurality of gate electrode layers 230 (e.g., gate electrode layers 231 to 239), stacked on the substrate 201 to be adjacent to the channel structure CH, and the like. The plurality of gate electrode layers 230 may be alternately stacked with the plurality of insulating layers 240 (e.g., insulating layers 241 to 249), and at least a portion of the gate electrode layer 239 may be divided into a plurality of pieces by the separation insulating layer 255.

In some example embodiments, as illustrated in FIG. 3, the channel area 210 may include a lower channel area 210A and an upper channel area 210B. The lower channel area 210A may be connected to the upper channel area 210B. The gate electrode layer 236, adjacent to a boundary between the lower channel area 210A and the upper channel area 210B, may provide a dummy memory cell DMC. In the dummy memory cell DMC, a programming operation may not be executed, in a manner different from other memory cells MC1 to MCn. The channel area 210 is formed by dividing the lower channel area 210A and the upper channel area 210B, so a problem in a process caused by an increase in the number of steps of the memory device 200 may be solved. The lower channel area 210A and the upper channel area 210B may be connected to each other, and may provide a substantially single channel area 210.

Other components, except for the channel area 210 and the dummy memory cell DMC, may be similar to the memory device 100 illustrated in FIG. 2. The gate electrode layers 230 may be divided into a plurality of regions by a common source line 251 and a spacer 209, and the common source line 251 may be connected to a source region 203 formed in the substrate 201. A gate insulating layer 260 may be formed between the channel area 210 and the gate electrode layers 230. The gate insulating layer 260 may have a plurality of layers, and a portion of the layers may be separately formed on an outer side surface of the channel area 210 and an outer side surface of the gate electrode layers 230.

Meanwhile, a portion among the plurality of channel structures CH may share a single bit line. For example, at least a portion among the plurality of channel structures CH, disposed in the same position in an X-axis direction, may be connected to the same bit line.

In some example embodiments, as illustrated in FIG. 3, a controller of the memory device 200 may be configured to control memory cells MC while the memory cells MC are divided into a plurality of memory areas. For example, the controller may be configured to control cells while cells disposed above the dummy memory cell DMC and cells disposed below the dummy memory cell DMC, among the plurality of memory cells MC, sharing a single channel area 210, are divided as memory areas different from each other.

FIG. 4 is a perspective view illustrating a portion of a memory cell array included in a memory device 300. In the memory device 300 according to some example embodiments, as illustrated in FIG. 4, a source region may not be formed in a substrate 301. A channel area 310 may have a curved U-shape, while each of a drain region of a string select transistor and a source region of a ground select transistor may be provided by a conductive layer 313 formed in each of both ends of the channel area 310.

Referring to FIG. 4, a plurality of gate electrode layers 330 (e.g., gate electrode layers 331 to 338) as well as a plurality of insulating layers 340 (e.g., insulating layers 341 to 349) may be alternately stacked, and an interior of a channel area 310 may be filled with an embedded insulating layer 315. An interlayer insulating layer 370 may be further formed on the plurality of gate electrode layers 330. Meanwhile, a gate insulating layer 360 may be formed between the gate electrode layers 330 and the channel area 310, and at least one of a plurality of layers, included in the gate insulating layer 360, may be formed along an outer side surface of the channel area 310.

Meanwhile, the gate electrode layers 330 may be divided into a plurality of pieces by a separation insulating layer 350. In some example embodiments, the separation insulating layer 350 may be provided between portions of the channel area 310 curved in a U-shape. Thus, the memory device 300 may be implemented to allow a single channel area 310, curved in a U-shape, to be adjacent to the gate electrode layers 330, divided into a plurality of pieces.

In some example embodiments, as illustrated in FIG. 4, a controller of the memory device 300 may be configured to control memory cells MC while the memory cells MC are divided into a plurality of memory areas. For example, the controller may control cells while cells disposed on one side of the separation insulating layer 350 and cells disposed on the other side of the separation insulating layer 350, among the plurality of memory cells MC, sharing a single channel area 310, are divided as memory areas different from each other.

Figure 5:
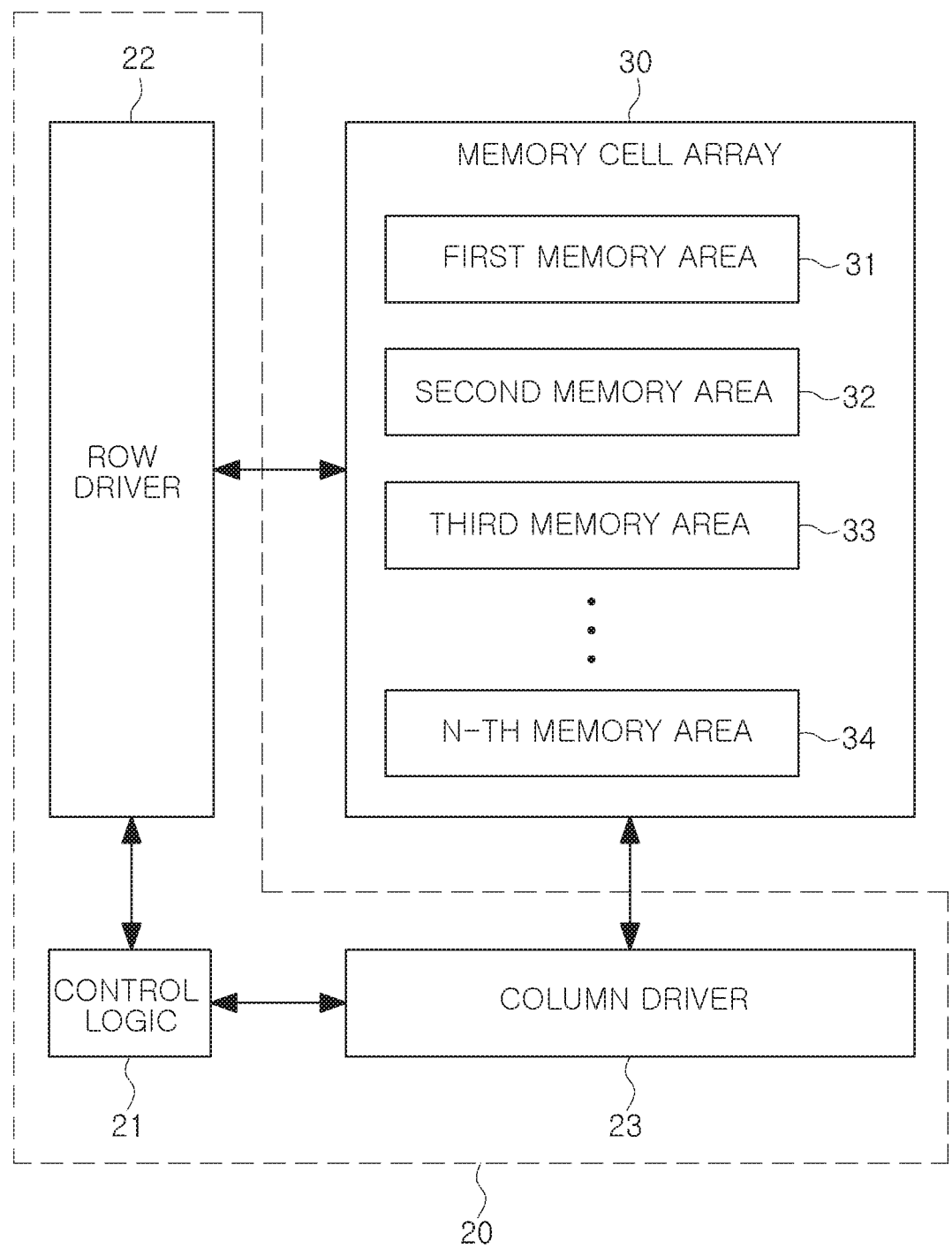
FIG. 5 is a schematic block diagram illustrating a memory device according to some example embodiments.

FIG. 5 is a schematic block diagram illustrating a memory device according to some example embodiments.

Referring to FIG. 5, a memory device 10 according to some example embodiments may include a controller 20 and a memory cell array 30. The controller 20 may include a control logic 21, a row driver 22, a column driver 23, and the like.

The memory cell array 30 may include a plurality of memory cells, as described previously with reference to FIGS. 1 to 4. The controller 20 may be configured to perform a programming operation for storing data in a plurality of memory cells included in the memory cell array 30, a reading operation for reading data stored in the plurality of memory cells, an erasing operation for erasing data stored in the plurality of memory cells, and the like.

The controller 20 may be configured to perform a controlling operation such as a programming operation, a reading operation, an erasing operation, and the like, while a plurality of memory cells, included in the memory cell array 30, are divided into a plurality of memory areas 31 to 34. For example, the plurality of memory areas 31 to 34 may be areas physically separated from each other, or areas virtually divided by the controller 20. In other words, in an example embodiment, a portion of a plurality of memory areas 31 to 34 may share a single channel area, or may be connected to a single bit line.

For example, assuming that the first memory area 31, the second memory area 32, and the third memory area 33 are connected to a single bit line, in order for a controller to perform a controlling operation on memory cells included in the first memory area 31, the controller may be configured to input a predetermined voltage even to memory cells included in the second memory area 32 and the third memory area 33. In this case, if a voltage, input to memory cells included in the second memory area 32 and the third memory area 33, is not properly selected, while a controlling operation is performed on the first memory area 31, a problem, in which characteristics of memory cells included in the second memory area 32 and the third memory area 33 may be deteriorated, or data, stored in the second memory area 32 and the third memory area 33, may be affected, or the like, may occur.

In some example embodiments, when a controlling operation is performed on a single selected memory area among the plurality of memory areas 31 to 34, based on a state of remaining areas connected to the same bit line to which the selected memory area is connected, a voltage, input to the remaining areas, may be determined. For example, the controller 20 may be configured to determine a voltage, input to each of the second memory area 32 and the third memory area 33, according to whether each of the second memory area 32 and the third memory area 33, connected to the same bit line to which the first memory area 31 is connected, shares a channel area, whether each of the second memory area 32 and the third memory area 33 is programmed, or the like, when a controlling operation is performed on at least one among memory cells included in the first memory area 31.

Figure 6:
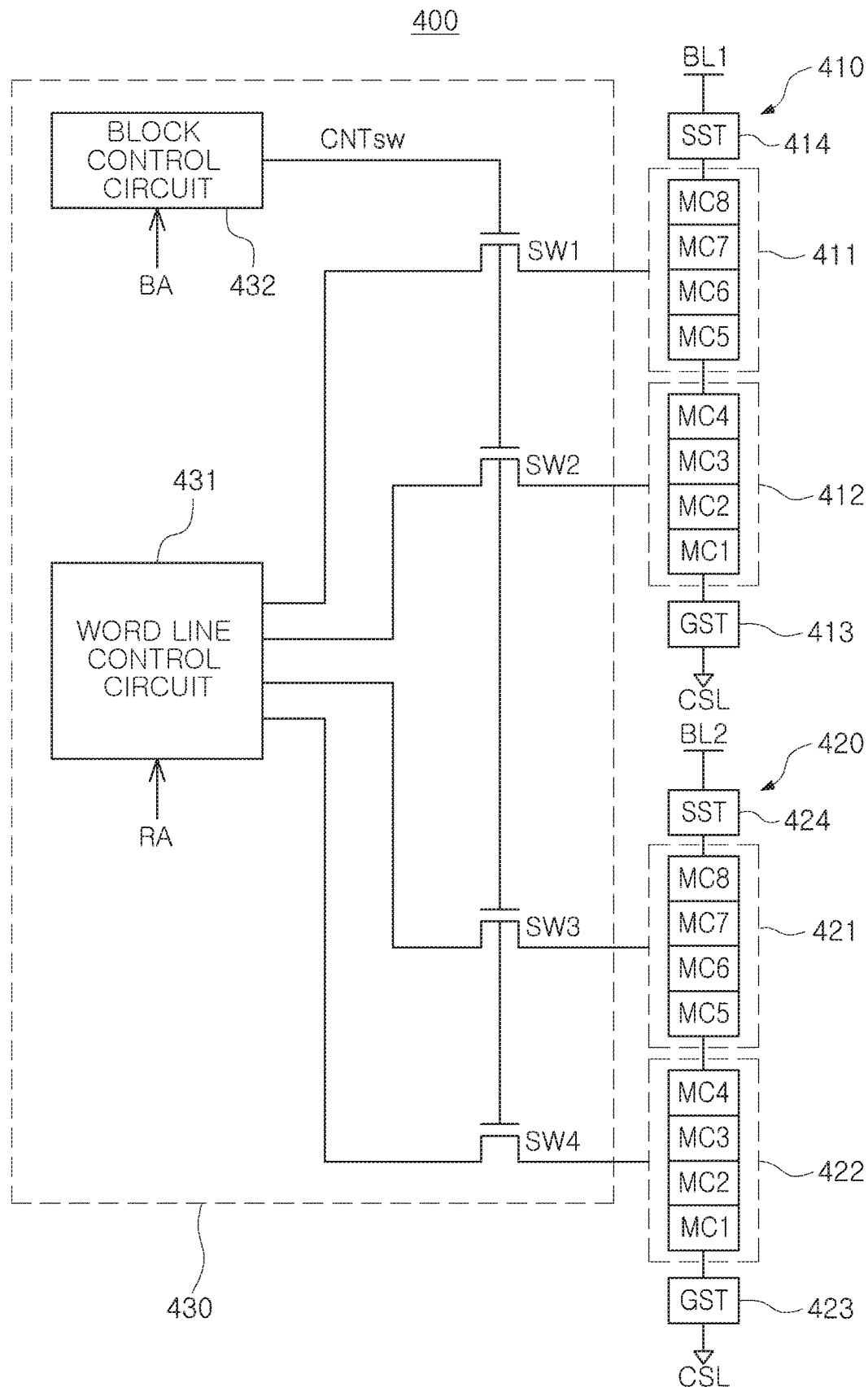
FIG. 6 is a view illustrating an operation of a memory device according to some example embodiments.

FIG. 6 is a view illustrating an operation of a memory device according to some example embodiments.

Referring to FIG. 6, a memory device 400 according to some example embodiments may include a plurality of memory cell strings 410, and 420 as well as a controller 430. A first memory cell string 410 may include a first memory area 411, a second memory area 412, a first ground select transistor 413, a first string select transistor 414, and the like. The first string select transistor 414 is connected to a bit line BL, and the first memory area 411 and the second memory area 412 may share a channel area in the first memory cell string 410.

Meanwhile, a second memory cell string 420 may include a third memory area 421, a fourth memory area 422, a second ground select transistor 423, a second string select transistor 424, and the like. The second memory cell string 420 is connected to the same bit line BL to which the first memory cell string 410 is connected, while the third memory area 421 and the fourth memory area 422 may share a single channel area. Meanwhile, each of the first string select transistor 414 and the second string select transistor 424 may be connected to string select lines different from each other.

The controller 430 may include a word line control circuit 431 and a block control circuit 432 as well as a plurality of switching devices SW1 to SW4. The word line control circuit 431 may be connected to a plurality of memory cells MC1 to MC8 connected to each of a first memory area 411, a second memory area 412, a third memory area 421, and a fourth memory area 422 through a plurality of switching devices SW1 to SW4. Whether the plurality of switching devices SW1 to SW4 are turned on/off may be determined by a switch control signal $CNT_{SW}$, output by the block control circuit 432.

The word line control circuit 431 may input a voltage, required for performing a controlling operation, to the plurality of memory cells MC1 to MC8, based on a row address RA. The controlling operation may include a programming operation, a reading operation, and the like. The block control circuit 432 may allow the plurality of switching devices SW1 to SW4 to be turned on, so as to allow the word line control circuit 431 to perform a controlling operation on the plurality of memory cells MC1 to MC8. The block control circuit 432 may determine whether the plurality of switching devices SW1 to SW4 is turned on/off, with reference to a block address BA.

When a memory cell on which the controller 430 is configured to perform a programming operation, a reading operation, or the like, is included in one of the first memory area 411, the second memory area 412, the third memory area 421, and the fourth memory area 422, the block control circuit 432 may allow the plurality of switching devices SW1 to SW4 to be turned on. A switch control signal $CNT_{SW}$, output by the block control circuit 432, is commonly connected to the plurality of switching devices SW1 to SW4, so the plurality of switching devices SW1 to SW4 may be simultaneously turned on.

For example, when a programming operation, a reading operation, or the like is performed on a fifth memory cell MC5 included in the first memory area 411, the plurality of switching devices SW1 to SW4 may be simultaneously turned on by the block control circuit 432. The word line control circuit 431 may input a voltage for performing a programming operation or a reading operation on the fifth memory cell MC5 to the memory cells MC1 to MC8, included in the first memory area 411 and the second memory area 412. For example, while a programming operation is performed on the fifth memory cell MC5, the word line control circuit 431 may input a programming voltage to the fifth memory cell MC5, and may input a pass voltage to remaining memory cells MC1 to MC4 and MC6 to MC8.

The first memory area 411 having the fifth memory cell MC5 is connected to the same bit line BL, to which the third memory area 421 and the fourth memory area 422 are connected, in addition to the second memory area 412, so a programming operation or a reading operation on the fifth memory cell MC5 may affect the second memory area 412, the third memory area 421, and the fourth memory area 422. In some example embodiments, to significantly reduce an effect of a programming operation or a reading operation on the fifth memory cell MC5 of the first memory area 411 on the second memory area 412, the third memory area 421, and the fourth memory area 422, the word line control circuit 431 may input an appropriate voltage to memory cells MC1 to MC8 of the second memory area 412, the third memory area 421, and the fourth memory area 422. The word line control circuit 431 may determine a voltage, input to memory cells MC1 to MC8 of the second memory area 412, the third memory area 421, and the fourth memory area 422, according to whether each of the second memory area 412, the third memory area 421, and the fourth memory area 422 is programmed, whether each of the second memory area 412, the third memory area 421, and the fourth memory area 422 shares a channel area with the first memory area 411, and the like.

In some example embodiments, while a programming operation or a reading operation is performed on the fifth memory cell MC5, a voltage, input to memory cells MC1 to MC4 of the second memory area 412, sharing a channel area with the first memory area 411, may be different from a voltage, input to memory cells MC1 to MC8 of the third memory area 421 and the fourth memory area 422, not sharing a channel area with the first memory area 411. For example, a voltage, input to memory cells MC1 to MC4 of the second memory area 412, may be higher than a voltage, input to memory cells MC1 to MC8 of the third memory area 421 and the fourth memory area 422. Moreover, when only one of the third memory area 421 and the fourth memory area 422 is programmed, the controller 430 may be configured to input different voltages to memory cells MC1 to MC8 of each of the third memory area 421 and the fourth memory area 422.

In addition, the controller 430 may be configured to set discharge characteristics of a voltage, input to memory cells MC1 to MC8 of each of the first memory area 411, the second memory area 412, the third memory area 421, and the fourth memory area 422, to be different from each other. While a programming operation or a reading operation is performed on the fifth memory cell MC5, the controller 430 may be configured to set a discharge point of a voltage, input to memory cells MC5 to MC8 of the second memory area 412, may be set to be different from a discharge point of a voltage, input to memory cells MC1 to MC8 of the third memory area 421 and the fourth memory area 422. In some example embodiments, the discharge point may be defined as a point in time at which a voltage, input to memory cells MC1 to MC8, begins to decrease. Moreover, in some example embodiments, a magnitude after a voltage, input to memory cells MC5 to MC8 of the second memory area 412, may be different from a magnitude after a voltage, input to memory cells MC1 to MC8 of the third memory area 421 and the fourth memory area 422.

Figure 7:
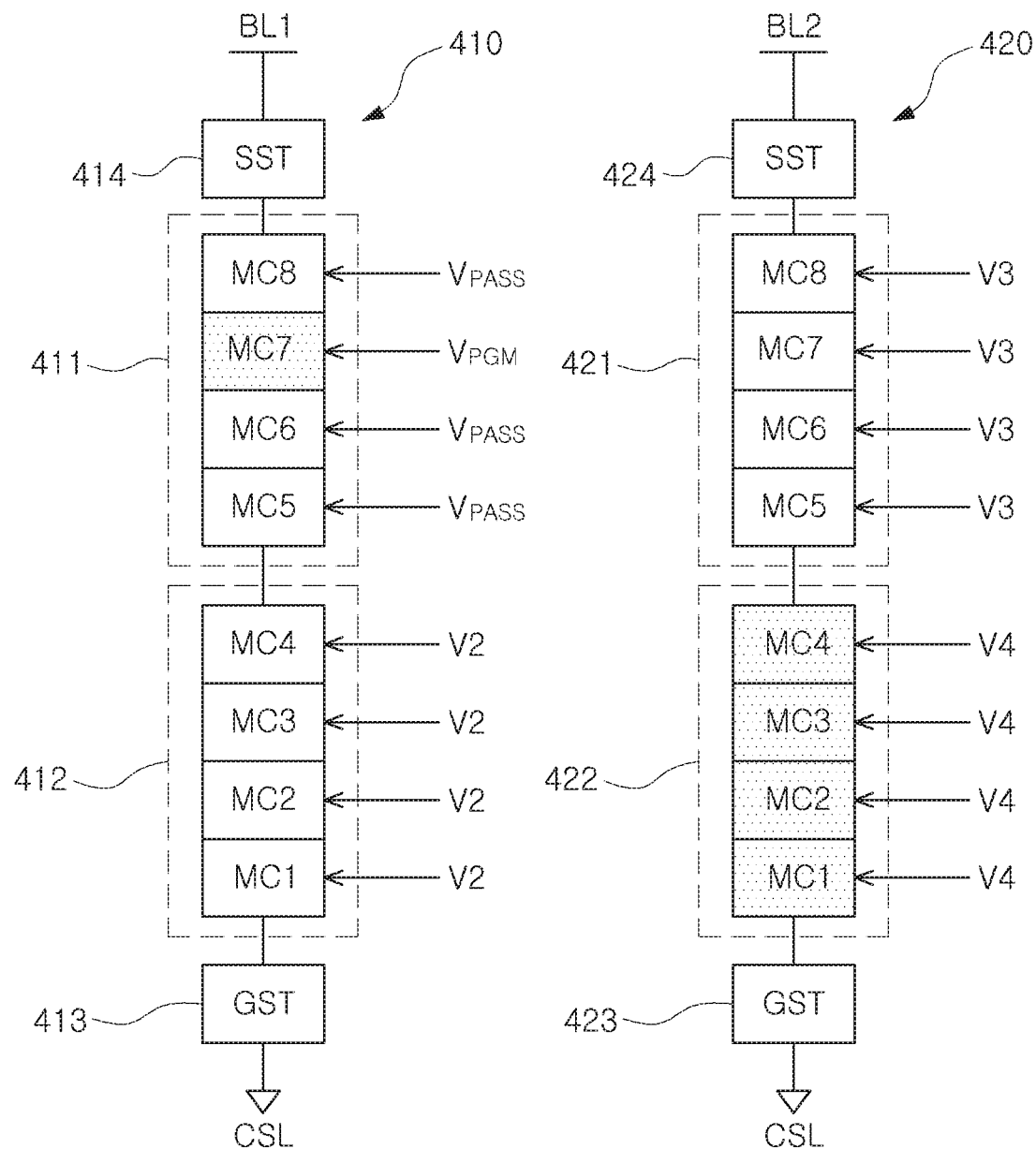
FIGS. 7 and 8 are views illustrating an operation of a memory device according to some example embodiments.
Figure 8:
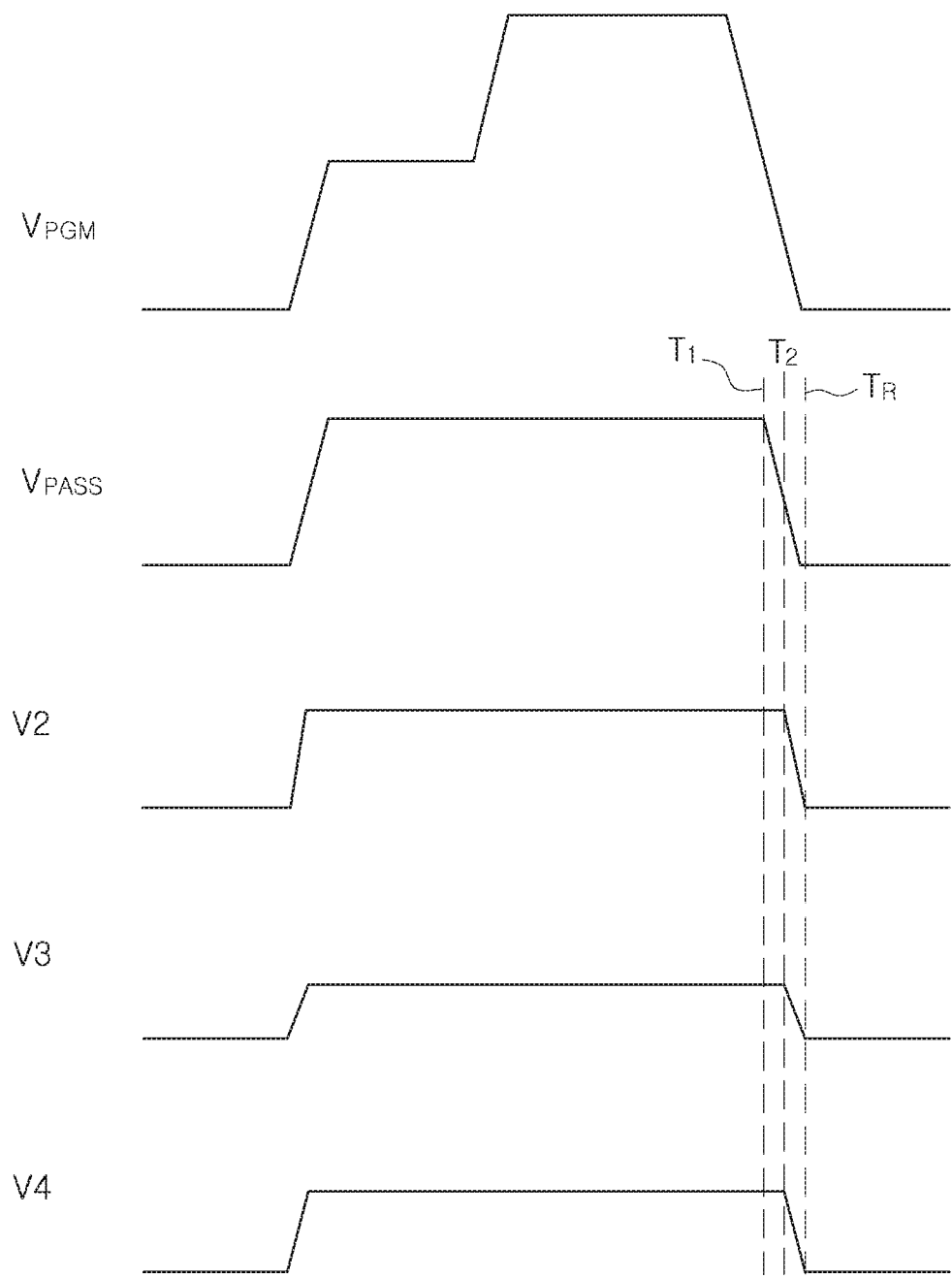

FIGS. 7 and 8 are views illustrating an operation of a memory device according to some example embodiments.

Referring to FIG. 7, a first memory cell string 410 may include a first memory area 411, a second memory area 412, a first ground select transistor 413, a first string select transistor 414, and the like. In the first memory cell string 410, the first memory area 411 and the second memory area 412 may share a channel area. Meanwhile, a second memory cell string 420 may include a third memory area 421, a fourth memory area 422, a second ground select transistor 423, a second string select transistor 424, and the like. In the second memory cell string 420, the third memory area 421 and the fourth memory area 422 may share a single channel area.

The first memory cell string 410 and the second memory cell string 420 may be connected to the same bit line BL. Moreover, the first string select transistor 414 and the second string select transistor 424, included in the first memory cell string 410 and the second memory cell string 420, respectively, may be different from each other. For example, the first string select transistor 414 and the second string select transistor 424 may be connected to the same bit line BL, and may be connected to string select lines different from each other.

In some example embodiments, as illustrated in FIG. 7, a programming operation to a seventh memory cell MC7, included in the first memory area 411, may be performed. A voltage bias condition of the first memory cell string 410 for performing a programming operation to the seventh memory cell MC7 may be as illustrated in Table 1.

TABLE 1

| BL1 | SST | MC7 | MC5, MC6, MC8 | MC1 to MC4 | GST | CSL |
|---|---|---|---|---|---|---|
| 0 | 0 | $V_{PGM}$ | $V_{PASS}$ | V2 | 0 | VDD |

In Table 1, a programming voltage $V_{PGM}$, input to a seventh memory cell MC7 as an operating voltage, may be higher than a pass voltage $V_{PASS}$, input to other memory cells MC5, MC6, and MC8 of the first memory area 411. Meanwhile, a second voltage V2 may be input to memory cells MC1 to MC4 of the second memory area 412, sharing the same channel area with the first memory area 411. In some example embodiments, a magnitude of the second voltage V2 may be determined to be different according to whether the second memory area 412 is programmed. For example, when at least one of memory cells MC1 to MC4 of the second memory area 412 stores data, the second memory area 412 may be determined to be programmed. Some example embodiments, as illustrated in FIG. 7, may correspond to a case in which the second memory area 412 is not programmed. In this case, the second voltage V2 may be lower than a pass voltage $V_{PASS}$.

Meanwhile, while a programming operation is performed on a seventh memory cell MC7 of the first memory area 411, a controller may input an appropriate voltage to memory cells MC1 to MC8 included in the third memory area 421 and the fourth memory area 422. Thus, an effect of the programming operation on the third memory area 421 and the fourth memory area 422 may be significantly reduced. For example, magnitudes of a third voltage V3 and a fourth voltage V4, input to memory cells MC1 to MC8 of the third memory area 421 and the fourth memory area 422, may be different from a magnitude of a second voltage V2, input to memory cells MC1 to MC4 of the second memory area 412. In this regard, in a manner different from the second memory area 412, the third memory area 421 and the fourth memory area 422 may not share a channel area with the first memory area 411, and may be connected not to a first string select transistor 414 but to a second string select transistor 424. In some example embodiments, magnitudes of the third voltage V3 and the fourth voltage V4 may be lower than the magnitude of the second voltage V2.

Meanwhile, magnitudes of the third voltage V3 and the fourth voltage V4 may be determined to be different from each other according to whether each of the third memory area 421 and the fourth memory area 422 is programmed. In some example embodiments illustrated in FIG. 7, the third memory area 421 may not be programmed, while the fourth memory area 422 may be programmed. In this case, the magnitude of the third voltage V3 may be lower than the magnitude of the fourth voltage V4.

Moreover, in some example embodiments, to perform a programming operation or a reading operation, a discharge point of a pass voltage $V_{PASS}$, input to the first memory area 411, having been selected, and a discharge point of the second voltage V2, the third voltage V3, and the fourth voltage V4, input to the second memory area 412, the third memory area 421, and the fourth memory area 422, not having been selected, may be set to be different from each other. Hereinafter, the following description will be made with reference to FIG. 8.

With reference to FIG. 8, a programming voltage $V_{PGM}$, input to a seventh memory cell MC7 of the first memory area 411, may be higher than a pass voltage $V_{PASS}$, input to other memory cells MC5, MC6, and MC8 of the first memory area 411. Moreover, as illustrated previously, magnitudes of the second voltage V2, the third voltage V3, and the fourth voltage V4, input to the second memory area 412, the third memory area 421, and the fourth memory area 422, may be lower than a magnitude of a pass voltage $V_{PASS}$. A magnitude of the second voltage V2 may be higher than magnitudes of the third voltage V3 and the fourth voltage V4, while the magnitude of the third voltage V3 may be lower than the magnitude of the fourth voltage V4.

Moreover, referring to FIG. 8, a discharge point, at which the second voltage V2, the third voltage V3, and the fourth voltage V4 start to decrease, may be different from a discharge point, at which a pass voltage $V_{PASS}$ starts to decrease. While the pass voltage $V_{PASS}$ starts to decrease at a first point in time $T_1$, the second voltage V2, the third voltage V3, and the fourth voltage V4 start to decrease at a second point in time $T_2$, later than the first point in time $T_1$. As illustrated previously, magnitudes of the second voltage V2, the third voltage V3, and the fourth voltage V4 may be lower than a magnitude of a pass voltage $V_{PASS}$. The second voltage V2, the third voltage V3, and the fourth voltage V4 are discharged at the second point in time $T_2$, later than the first point in time $T_1$, so a point in time $T_R$, at which discharging of a pass voltage $V_{PASS}$ is completed, and a point in time $T_R$, at which discharging of the second voltage V2, the third voltage V3, and the fourth voltage V4 is completed, may be substantially coincident. Thus, by a programming operation to the first memory area 411, deterioration of memory cells MC1 to MC8, which may appear in the second memory area 412, the third memory area 421, and the fourth memory area 422, may be significantly reduced.

Example embodiments, described with reference to FIGS. 7 and 8, may be similarly applied even in a case in which not a programming operation but a reading operation is performed. By a voltage bias condition, different from that in Table 1, a reading operation may be performed on the first memory area 411. In this case, a magnitude of each of the second voltage V2, the third voltage V3, and the fourth voltage V4 may vary according to whether each of the second memory area 412, the third memory area 421, and the fourth memory area 422 is programmed, whether each thereof shares a channel area with the first memory area 411, whether each thereof is connected to the same first string select transistor 414, to which the first memory area 411 is connected.

Figure 9:
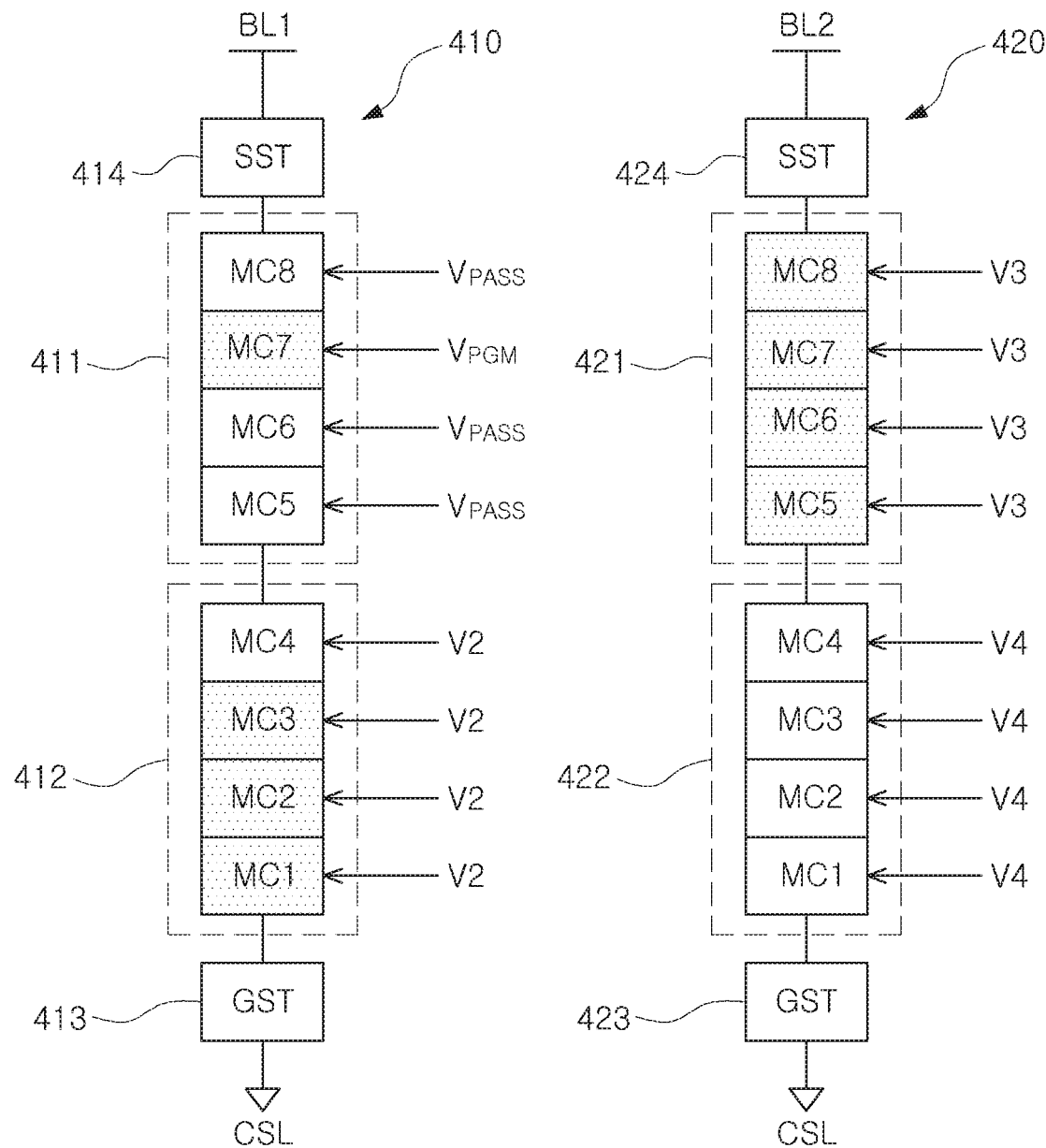
FIGS. 9 and 10 are views illustrating an operation of a memory device according to some example embodiments.
Figure 10:
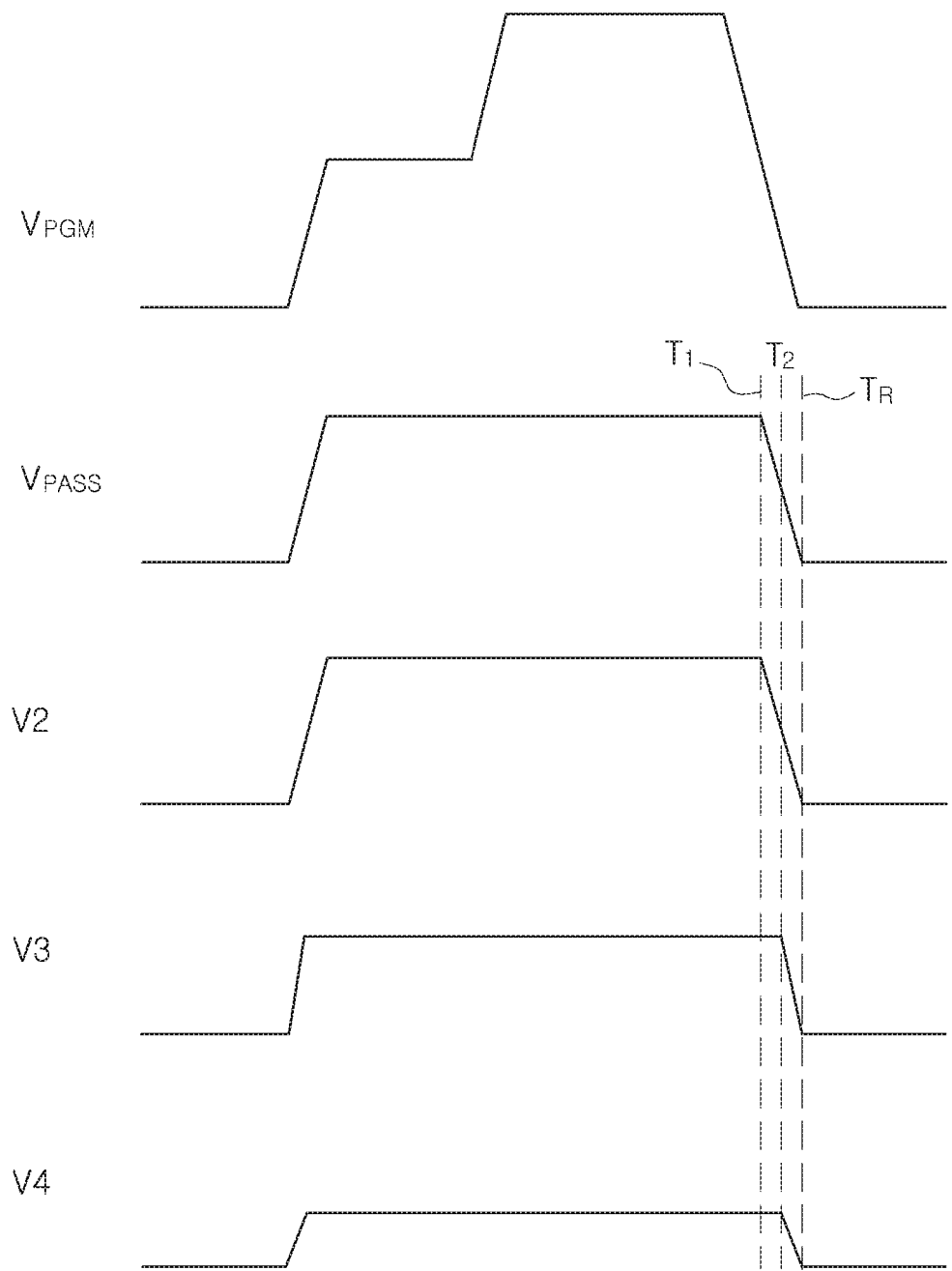

FIGS. 9 and 10 are views illustrating an operation of a memory device according to some example embodiments.

In some example embodiments illustrated in FIGS. 9 and 10, a configuration of memory cell strings 410 and 420 may be similar to that in some example embodiments described with reference to FIGS. 7 and 8. First, referring to FIG. 9, a programming operation to a seventh memory cell MC7 may be performed. A voltage bias condition of the first memory cell string 410 for performing a programming operation to the seventh memory cell MC7 may be as illustrated in Table 1, illustrated previously. For example, a programming voltage $V_{PGM}$ is input to the seventh memory cell MC7 as an operating voltage, and a pass voltage $V_{PASS}$, different from the operating voltage, may be input to other memory cells MC5, MC6, and MC8 of the first memory area 411.

Meanwhile, in a manner different from some example embodiments illustrated with reference to FIG. 7, in some example embodiments illustrated with reference to FIG. 9, a second voltage V2, input to memory cells MC1 to MC4 of the second memory area 412, may have a magnitude equal to that of the pass voltage $V_{PASS}$. In a manner different from an example embodiment illustrated with reference to FIG. 7, in an example embodiment illustrated with reference to FIG. 9, the second memory area 412 may be programmed. Thus, in some example embodiments, as illustrated in FIG. 9, the second voltage V2 may have a magnitude equal to that of a pass voltage $V_{PASS}$.

Meanwhile, a controller may be configured to input a third voltage V3 and a fourth voltage V4 to the third memory area 421 and the fourth memory area 422, respectively, thereby significantly reducing an effect of a programming operation with respect to the seventh memory cell MC7 on the third memory area 421 and the fourth memory area 422. For example, magnitudes of the third voltage V3 and the fourth voltage V4, input to memory cells MC1 to MC8 of the third memory area 421 and the fourth memory area 422, may be different from a magnitude of a second voltage V2, input to memory cells MC1 to MC4 of the second memory area 412. In this regard, in a manner different from a manner in which the second memory area 412 is connected to the first memory area 411 and the first string select transistor 414, the third memory area 421 and the fourth memory area 422 are connected to a second string select transistor 424. In some example embodiments, magnitudes of the third voltage V3 and the fourth voltage V4 may be lower than the magnitude of the second voltage V2.

The magnitudes of the third voltage V3 and the fourth voltage V4 may be determined to be different from each other according to whether each of the third memory area 421 and the fourth memory area 422 is programmed. In some example embodiments illustrated in FIG. 9, the third memory area 421 may be programmed, while the fourth memory area 422 may not be programmed. In this case, the magnitude of the third voltage V3 may be higher than the magnitude of the fourth voltage V4.

Moreover, as illustrated with reference to FIGS. 7 and 8 previously, in some example embodiments, as illustrated in FIG. 9, a discharge point of a pass voltage $V_{PASS}$, input to the first memory area 411, and a discharge point of at least a portion of the second voltage V2, the third voltage V3, and the fourth voltage V4, input to the second memory area 412, the third memory area 421, and the fourth memory area 422, not having been selected, may be set to be different from each other. Hereinafter, the following description will be made with reference to FIG. 10.

With reference to FIG. 10, a programming voltage $V_{PGM}$, input to a seventh memory cell MC7 of the first memory area 411, may be higher than a pass voltage $V_{PASS}$, input to other memory cells MC5, MC6, and MC8 of the first memory area 411. In addition, the second voltage V2, input to memory cells MC1 to MC4 of the second memory area 412, may be the same as a pass voltage $V_{PASS}$. A discharge point, at which the second voltage V2 starts to decrease, may be the first point in time $T_1$, the same as a discharge point of a pass voltage $V_{PASS}$.

Meanwhile, the third voltage V3 and the fourth voltage V4, input to the third memory area 421 and the fourth memory area 422, respectively, may have a magnitude, lower than that of the pass voltage $V_{PASS}$. In some example embodiments, as illustrated in FIG. 9, the third memory area 421 may be only programmed, so a magnitude of the third voltage V3 may be higher than a magnitude of the fourth voltage V4.

Moreover, a discharge point, at which the third voltage V3 and the fourth voltage V4 start to decrease, may be different from a discharge point, at which the pass voltage $V_{PASS}$ and the second voltage V2 start to decrease. While the pass voltage $V_{PASS}$ and the second voltage V2 start to decrease at a first point in time $T_1$, the third voltage V3 and the fourth voltage V4 start to decrease at a second point in time $T_2$, later than the first point in time $T_1$. The third voltage V3 and the fourth voltage V4 are discharged at the second point in time $T_2$, later than the first point in time T1, so a point in time $T_R$, at which discharging of a pass voltage $V_{PASS}$ and the second voltage V2 is completed, and a point in time $T_R$, at which discharging of the third voltage V3 and the fourth voltage V4 is completed, may be substantially coincident. Thus, by a programming operation on the first memory area 411, deterioration of memory cells MC1 to MC8, which may appear in the second memory area 412, the third memory area 421, and the fourth memory area 422, may be significantly reduced.

Figure 11:
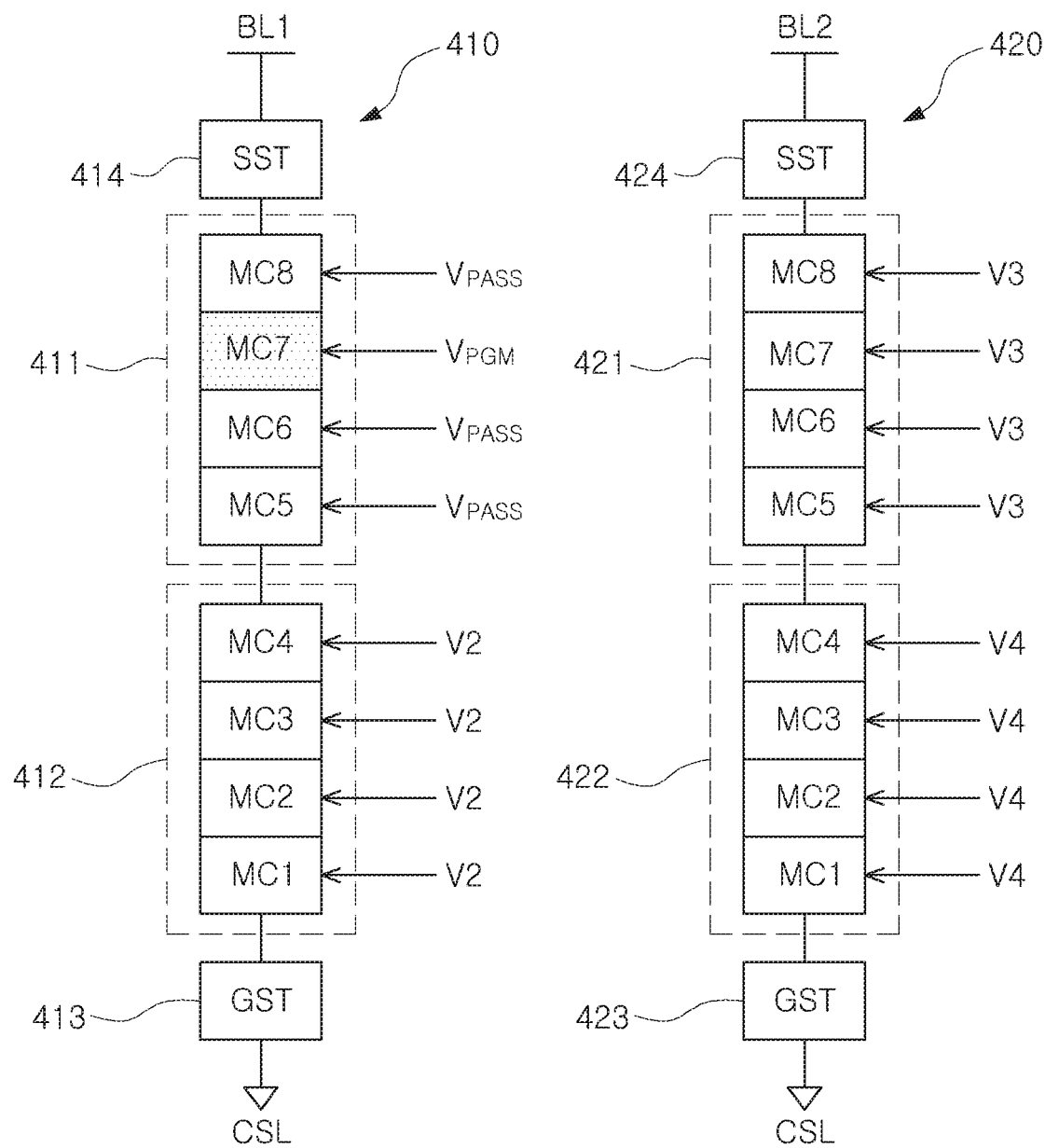
FIGS. 11 and 12 are views illustrating an operation of a memory device according to some example embodiments.
Figure 12:
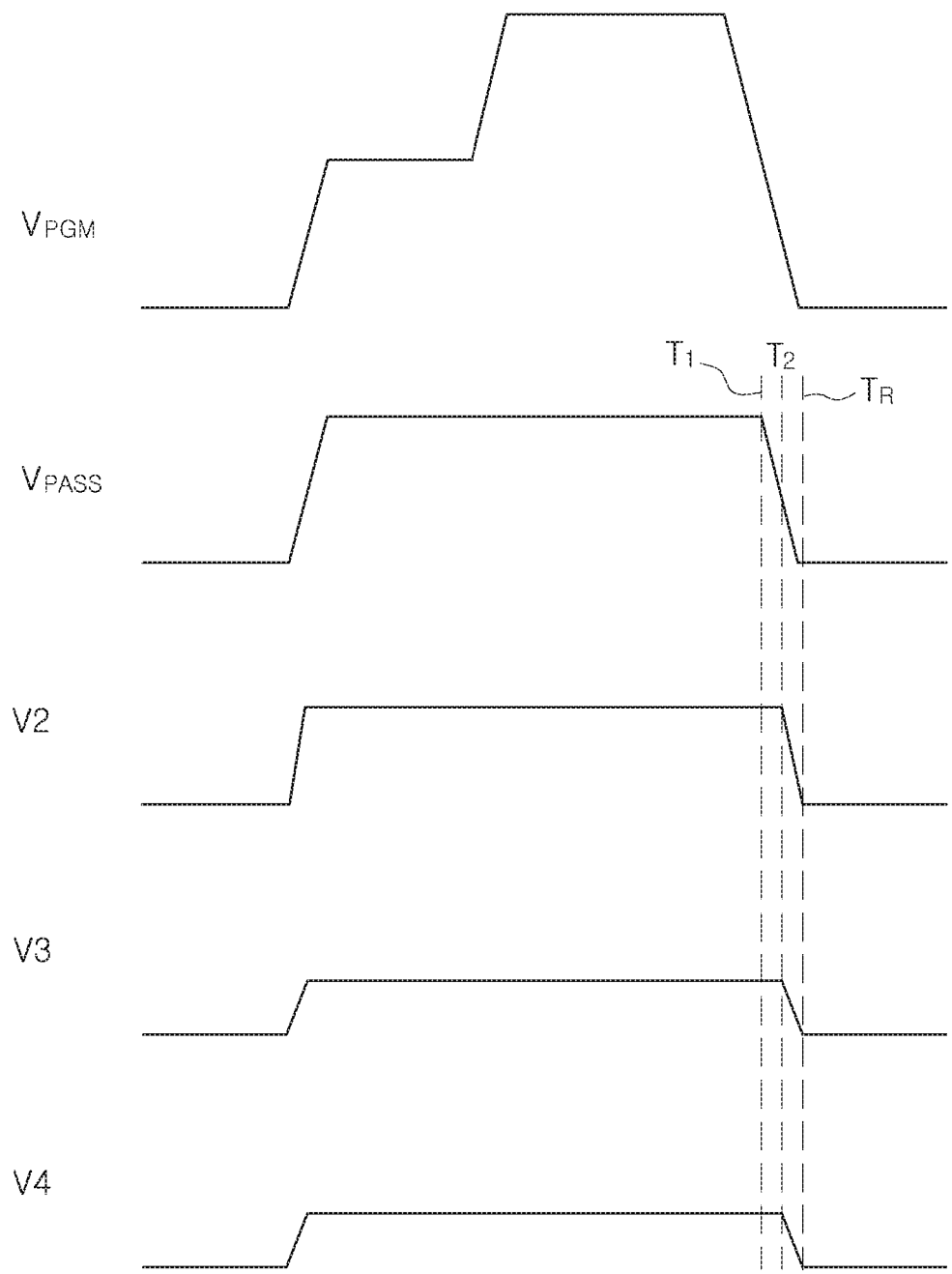

FIGS. 11 and 12 are views illustrating an operation of a memory device according to some example embodiments.

In some example embodiments, as illustrated in FIGS. 11 and 12, a configuration of memory cell strings 410 and 420 may be similar to that in some example embodiments described with reference to FIGS. 7 and 10. In other words, the memory cell strings 410 and 420 are connected to a single bit line BL, and may have channel areas different from each other. First, in some example embodiments, as illustrated in FIG. 11, a programming operation to a seventh memory cell MC7, included in the first memory area 411, may be performed. A voltage bias condition of the first memory cell string 410 for performing a programming operation to the seventh memory cell MC7 may be as illustrated in Table 1, illustrated previously.

In some example embodiments, as illustrated with reference to FIG. 11, a second voltage V2, input to memory cells MC1 to MC4 of the second memory area 412, may have a magnitude lower than that of the pass voltage $V_{PASS}$. With reference to FIG. 11, memory cells MC1 to MC4 of the second memory area 412 may not be programmed, so the second voltage V2 may be lower than a pass voltage $V_{PASS}$.

A controller may be configured to input a third voltage V3 and a fourth voltage V4 to the third memory area 421 and the fourth memory area 422, respectively, thereby significantly reducing an effect of a programming operation with respect to the seventh memory cell MC7 of the first memory area 411 on memory cells MC1 to MC8 of the third memory area 421 and the fourth memory area 422. In some example embodiments, magnitudes of the third voltage V3 and the fourth voltage V4, input to memory cells MC1 to MC8 of the third memory area 421 and the fourth memory area 422, may be different from a magnitude of a second voltage V2. In this regard, in a manner different from a manner in which the second memory area 412 shares the same channel area with the first memory area 411, the third memory area 421 and the fourth memory area 422 do not share a channel area with the first memory area 411. In some example embodiments, magnitudes of the third voltage V3 and the fourth voltage V4 may be lower than the magnitude of the second voltage V2.

The magnitudes of the third voltage V3 and the fourth voltage V4 may be determined to be different from each other according to whether each of the third memory area 421 and the fourth memory area 422 is programmed. In some example embodiments, as illustrated in FIG. 11, the third memory area 421 and the fourth memory area 422 may not be programmed. Thus, in some example embodiments, as illustrated in FIG. 11, magnitudes of the third voltage V3 and the fourth voltage V4 may be equal to each other.

As described previously, in some example embodiments, as illustrated in FIG. 11, a discharge point of a pass voltage $V_{PASS}$, input to the first memory area 411, and a discharge point of at least a portion of the second voltage V2, the third voltage V3, and the fourth voltage V4, input to the second memory area 412, the third memory area 421, and the fourth memory area 422 may be different from each other. Hereinafter, the following description will be made with reference to FIG. 12.

With reference to FIG. 12, a programming voltage $V_{PGM}$, input to a seventh memory cell MC7 of the first memory area 411, may be higher than a pass voltage $V_{PASS}$, input to other memory cells MC5, MC6, and MC8 of the first memory area 411. In addition, the second memory area 412 is not programmed, so the second voltage V2, input to memory cells MC1 to MC4 of the second memory area 412, may be lower than a pass voltage $V_{PASS}$. Meanwhile, the third voltage V3 and the fourth voltage V4, input to the third memory area 421 and the fourth memory area 422, respectively, may have the same magnitude. The magnitudes of the third voltage V3 and the fourth voltage V4 may be lower than a magnitude of the second voltage V2.

Moreover, a discharge point, at which the second voltage V2, the third voltage V3, and the fourth voltage V4 start to decrease, may be different from a discharge point, at which a pass voltage $V_{PASS}$ starts to decrease. While the pass voltage $V_{PASS}$ starts to decrease at a first point in time $T_1$, the second voltage V2, the third voltage V3, and the fourth voltage V4 may start to decrease at a second point in time $T_2$, later than the first point in time $T_1$. The second voltage V2, the third voltage V3, and the fourth voltage V4 are discharged at the second point in time $T_2$, later than the first point in time $T_1$, so a point in time $T_R$, at which discharging of a pass voltage $V_{PASS}$ is completed, and a point in time $T_R$, at which discharging of the second voltage V2, the third voltage V3, and the fourth voltage V4 is completed, may be substantially coincident. Thus, by a programming operation to the first memory area 411, deterioration of memory cells MC1 to MC8, which may appear in the second memory area 412, the third memory area 421, and the fourth memory area 422, may be significantly reduced.

Example embodiments, described with reference to FIGS. 7 to 12, may be similarly applied even in a case in which a reading operation is performed. For example, in some example embodiments, as illustrated in FIGS. 7 to 12, when a reading operation for reading data stored in the fifth memory cell MC5 of the first memory area 411 is performed, a voltage bias condition with respect to a first memory cell string 410 may be as illustrated in Table 2. Voltages may be applied under a bias condition illustrated in Table 2, and data, stored in a seventh memory cell MC7, may be read through a bit line BL.

TABLE 2

| SST | MC5 | MC6 to MC8 | MC1 to MC4 | GST | CSL |
|---|---|---|---|---|---|
| $V_{PASS}$ | $V_{READ}$ | $V_{PASS}$ | V2 | $V_{PASS}$ | 0 |

In a bias condition illustrated in Table 2, a pass voltage $V_{PASS}$ may be lower than a pass voltage $V_{PASS}$, supplied to the first memory cell string 410 during a programming operation. Meanwhile, a reading voltage $V_{READ}$, input to the fifth memory cell MC5 in which data is to be read, may be lower than a pass voltage $V_{PASS}$, input to other memory cells MC6 to MC8, the ground select transistor GST, the string select transistor SST, and the like.

Each of the second voltage V2, the third voltage V3, and the fourth voltage V4, input to the second memory area 412, the third memory area 421, and the fourth memory area 422, in a reading operation may be determined to be different according to whether each thereof shares the same channel area with the first memory area 411, whether each of the second memory area 412, the third memory area 421, and the fourth memory area 422 is programmed, or the like. For example, a magnitude of the second voltage V2, input to the second memory area 412, sharing the same channel area, with the first memory area 411, may be higher than magnitudes of the third voltage V3 and the fourth voltage V4.

The second voltage V2 may have a magnitude, equal to or lower than that of a pass voltage $V_{PASS}$ according to whether the second memory area 412 is programmed. In some example embodiments, as illustrated in FIG. 11, a second memory area 412 may not be programmed, so the second voltage V2 may be lower than a pass voltage $V_{PASS}$. On the other hand, in some example embodiments, as illustrated in FIG. 9, a second memory area 412 may be programmed, so the second voltage V2 may have a magnitude equal to that of a pass voltage $V_{PASS}$.

A magnitude of each of the third voltage V3 and the fourth voltage V4 may be determined according to whether each of the third memory area 421 and the fourth memory area 422 is programmed. For example, when the third memory area 421 and the fourth memory area 422 are programmed, the third voltage V3 and the fourth voltage V4 may have the same magnitude. On the other hand, when the third memory area 421 is programmed, but the fourth memory area 422 is not programmed, a magnitude of the third voltage V3 may be higher than that of the fourth voltage V4. On the other hand, when the third memory area 421 is not programmed, but the fourth memory area 422 is programmed, a magnitude of the third voltage V3 may be lower than that of the fourth voltage V4.

Figure 13:
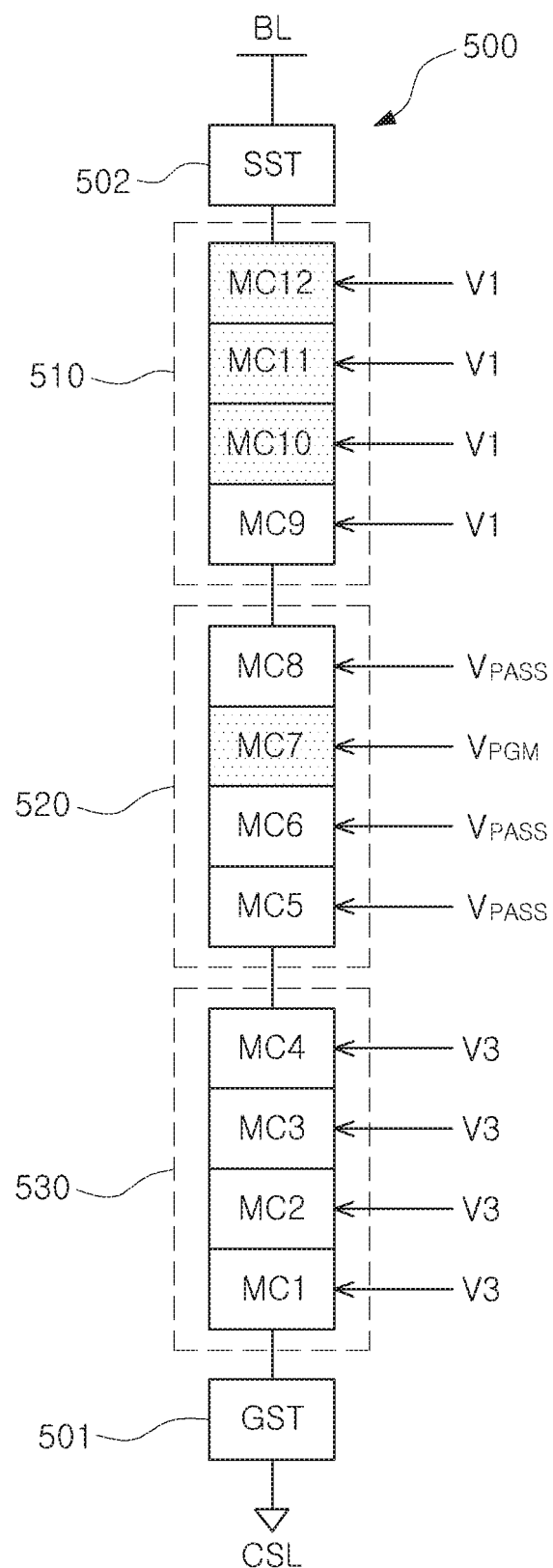
FIGS. 13 and 14 are views illustrating an operation of a memory device according to some example embodiments.
Figure 14:
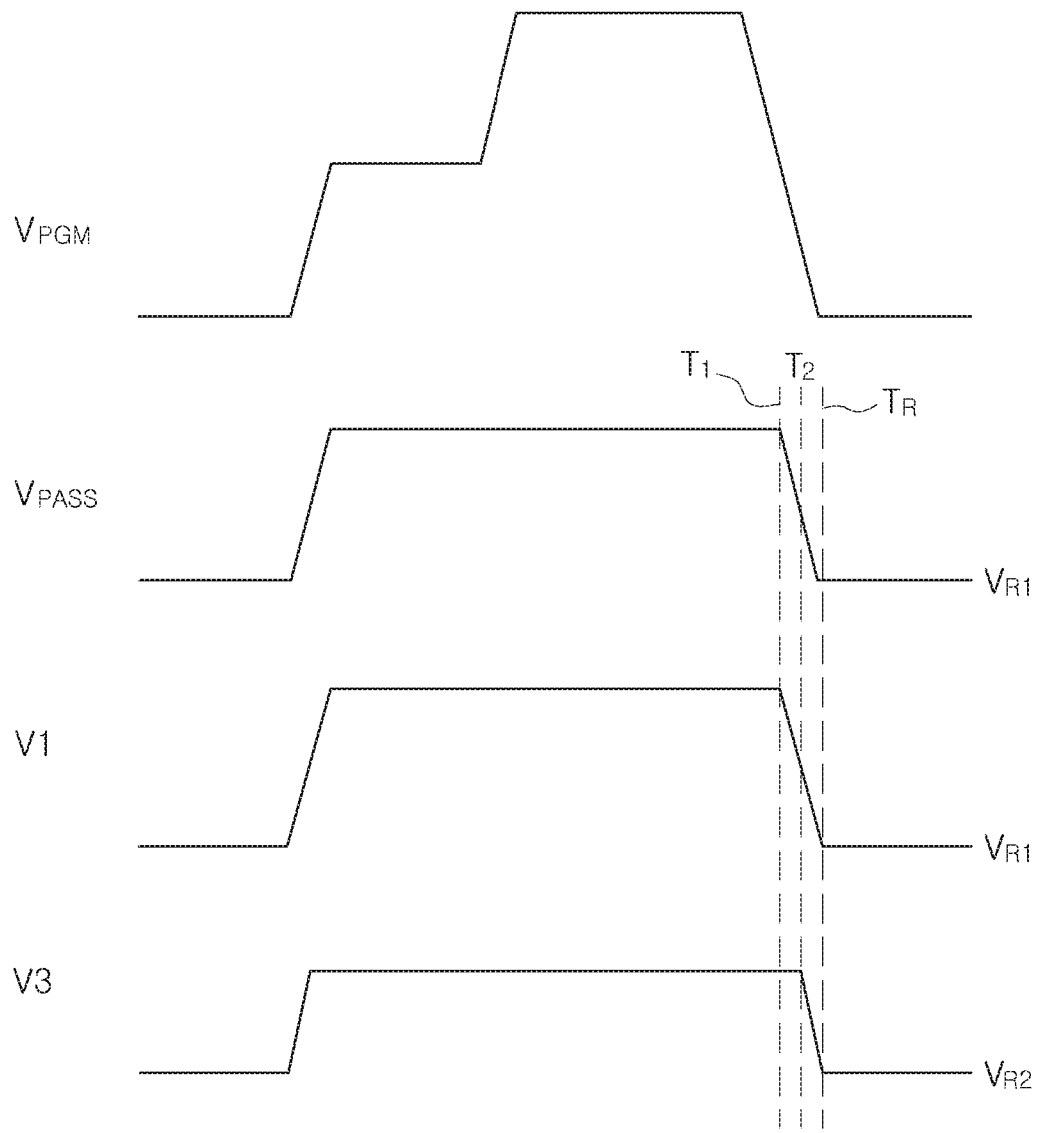

FIGS. 13 and 14 are views illustrating an operation of a memory device according to some example embodiments.

Referring to FIG. 13, a memory device according to some example embodiments may include a memory cell string 500. A memory cell string 500 may include a first memory area 510, a second memory area 520, a third memory area 530, a ground select transistor 501, a string select transistor 502, and the like. The string select transistor 502 is connected to a bit line BL, and the ground select transistor 501 may be connected to a common source line CSL. The first memory area 510, the second memory area 520, and the third memory area 530 may be connected to a single bit line BL, and may share a single channel area.

In some example embodiments, as illustrated in FIG. 13, a programming operation to a seventh memory cell MC7, included in the second memory area 520, may be performed. While the programming operation to the seventh memory cell MC7 is performed, a bias condition of a voltage, input to each of memory cells MC1 to MC12, the ground select transistor GST, the string select transistor SST, the common source line CSL, and the bit line BL, may be as illustrated in Table 3.

TABLE 3

| BL | SST | MC7 | MC5, MC6, MC8 | MC9 to MC12 | MC1 to MC4 | GST | CSL |
|----|-----|-----|---------------|-------------|------------|-----|-----|
| 0 | 0 | $V_{PGM}$ | $V_{PASS}$ | V1 | V3 | 0 | VDD |

A programming voltage $V_{PGM}$, input to the seventh memory cell MC7, may be higher than a pass voltage $V_{PASS}$, input to other memory cells MC5, MC6, and MC8 of the second memory area 520. The first voltage V1 and the third voltage V3, input to memory cells MC9 to MC12 of the first memory area 510 and memory cells MC1 to MC4 of the third memory area 530, respectively, may be determined according to whether each of the first memory area 510 and the third memory area 530 is programmed.

With reference to FIG. 13, the first memory area 510 may be programmed, while the third memory area 530 may not be programmed. Thus, in some example embodiments, as illustrated in FIG. 13, a magnitude of the first voltage V1 may be higher than a magnitude of the third voltage V3. For example, the first voltage V1 may have a magnitude equal to that of a pass voltage $V_{PASS}$, while the third voltage V3 may have a magnitude lower than that of the pass voltage $V_{PASS}$.

With reference to FIG. 14, the first voltage V1 may have a wave form the same as that of a pass voltage $V_{PASS}$. In other words, the first voltage V1 starts to discharge at the first point in time $T_1$, the same as that at which the pass voltage $V_{PASS}$ starts to discharge, and the first voltage V1 and the pass voltage $V_{PASS}$ are discharged, and then may be reduced to a first recovery voltage $V_{R1}$. On the other hand, the third voltage V3 may have a magnitude lower than that of the pass voltage $V_{PASS}$, and may start to discharge at a second point in time $T_2$, later than the first point in time $T_1$. Moreover, the third voltage V3 may be discharged to the second recovery voltage $V_{R2}$, and the second recovery voltage $V_{R2}$ may have a value different from that of the first recovery voltage $V_{R1}$. The third voltage V3 may be a sub-pass voltage, lower than the pass voltage $V_{PASS}$, and may be input to the third memory area 530, which is not programmed, so a soft program phenomenon in which a threshold voltage of memory cells MC1 to MC4 of the third memory area 530 is changed by a programming operation to the seventh memory cell MC7 may be prevented.

Figure 15:
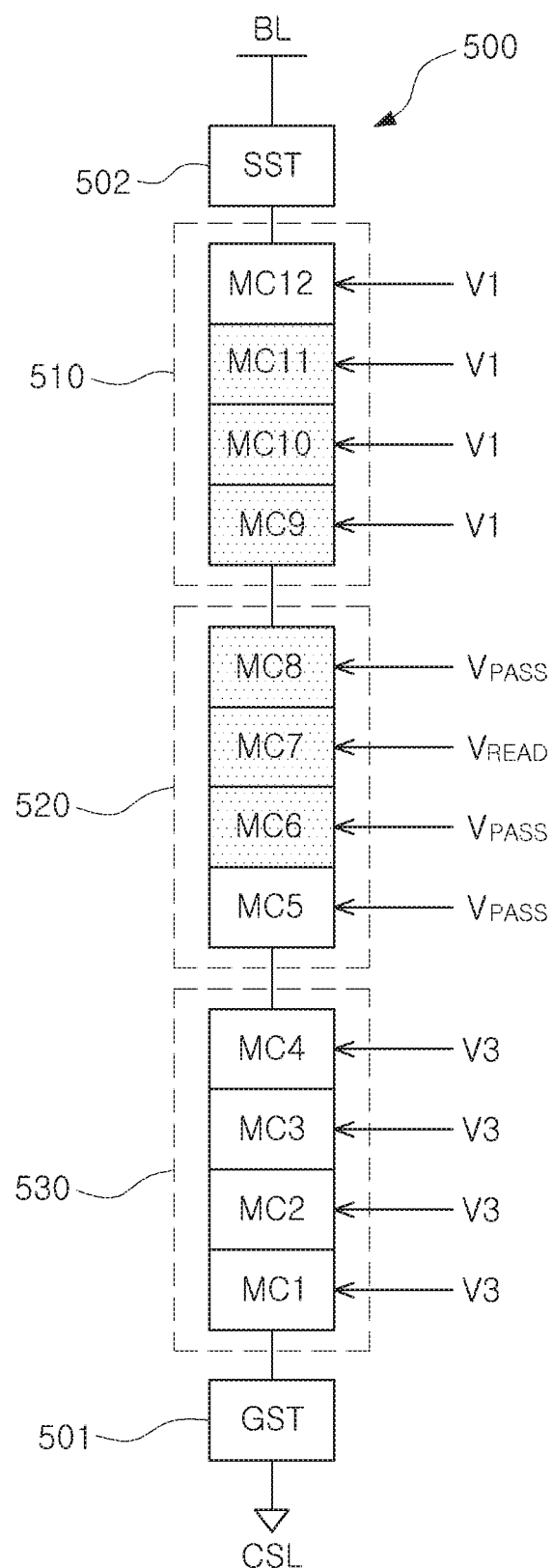
FIGS. 15 and 16 are views illustrating an operation of a memory device according to some example embodiments.
Figure 16:
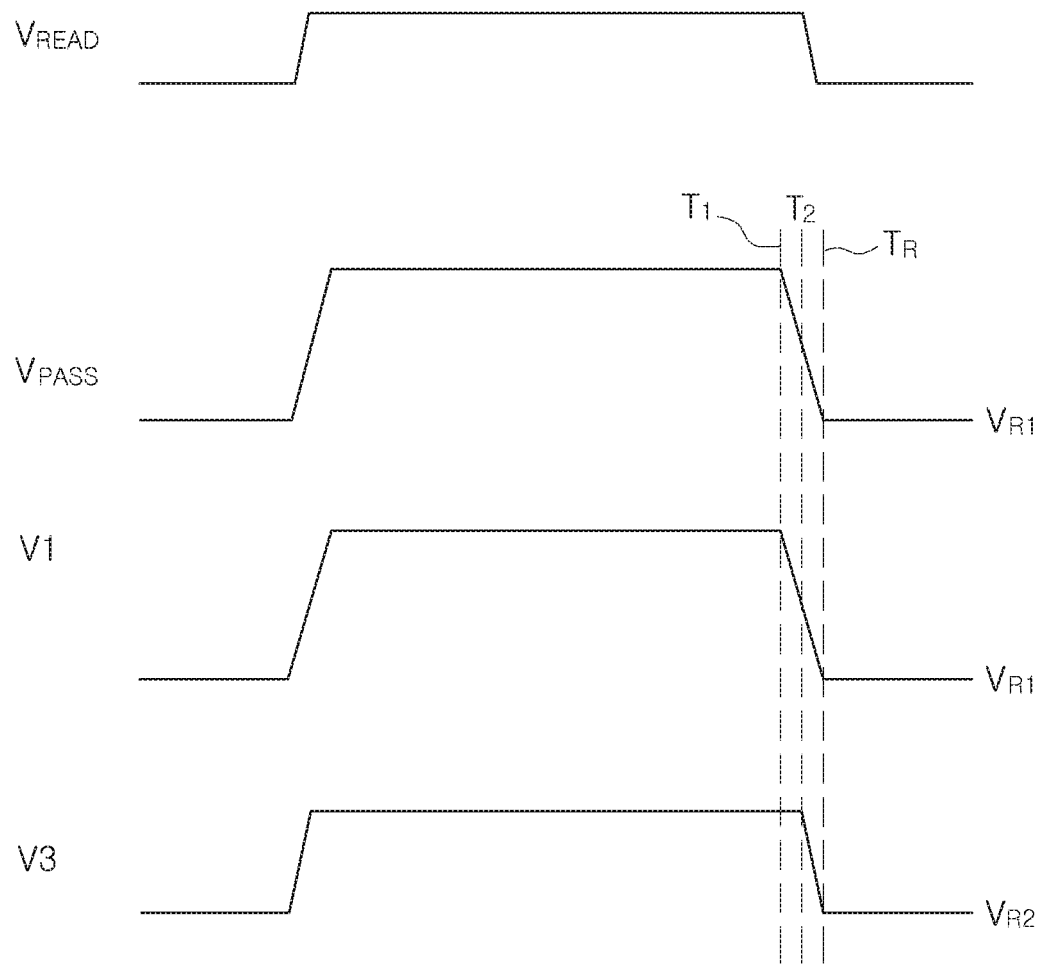

FIGS. 15 and 16 are views illustrating an operation of a memory device according to some example embodiments.

A memory device according to some example embodiments, as illustrated in FIG. 15, may include a memory cell string 500. A structure of the memory cell string 500 may be the same as that illustrated with reference to FIG. 13.

In some example embodiments, as illustrated in FIG. 15, a reading operation on a seventh memory cell MC7, included in the second memory area 520, may be performed. While the reading operation is performed on the seventh memory cell MC7, a bias condition of a voltage, input to each of memory cells MC1 to MC12, the ground select transistor GST, the string select transistor SST, the common source line CSL, and the bit line BL, may be as illustrated in Table 4.

TABLE 4

| SST | MC7 | MC5, MC6, MC8 | MC9 to MC12 | MC1 to MC4 | GST | CSL |
|-----|-----|---------------|-------------|------------|-----|-----|
| $V_{PASS}$ | $V_{READ}$ | $V_{PASS}$ | V1 | V3 | $V_{PASS}$ | 0 |

A reading voltage $V_{READ}$, input to the seventh memory cell MC7, may be lower than a pass voltage $V_{PASS}$, input to other memory cells MC5, MC6, and MC8 of the second memory area 520, the ground select transistor GST, the string select transistor SST, and the like. The first voltage V1 and the third voltage V3, input to memory cells MC9 to MC12 of the first memory area 510 and memory cells MC1 to MC4 of the third memory area 530, respectively, may be determined according to whether each of the first memory area 510 and the third memory area 530 is programmed.

With reference to FIG. 15, the first memory area 510 may be programmed, while the third memory area 530 may not be programmed. In some example embodiments, as illustrated in FIG. 15, a magnitude of the first voltage V1 may be higher than a magnitude of the third voltage V3. For example, the first voltage V1 may have a magnitude equal to that of a pass voltage $V_{PASS}$, while the third voltage V3 may have a magnitude lower than that of the pass voltage $V_{PASS}$.

With reference to FIG. 16, the first voltage V1 may have a wave form the same as that of a pass voltage $V_{PASS}$. In other words, the first voltage V1 starts to discharge at the first point in time $T_1$ in the same manner as the pass voltage $V_{PASS}$, and the first voltage V1 and the pass voltage $V_{PASS}$ are discharged, and then may be reduced to a first recovery voltage $V_{R1}$. On the other hand, the third voltage V3 may have a magnitude lower than that of the pass voltage $V_{PASS}$, and may start to discharge at a second point in time $T_2$, later than the first point in time $T_1$. Moreover, the third voltage V3 may be discharged to the second recovery voltage $V_{R2}$, and the second recovery voltage $V_{R2}$ may have a value different from that of the first recovery voltage $V_{R1}$. The third voltage V3, lower than the pass voltage $V_{PASS}$, is input to the third memory area 530, which is not programmed, so a soft program phenomenon in which a threshold voltage of memory cells MC1 to MC4 of the third memory area 530 is changed by a reading operation on the seventh memory cell MC7 may be prevented.

Figure 17:
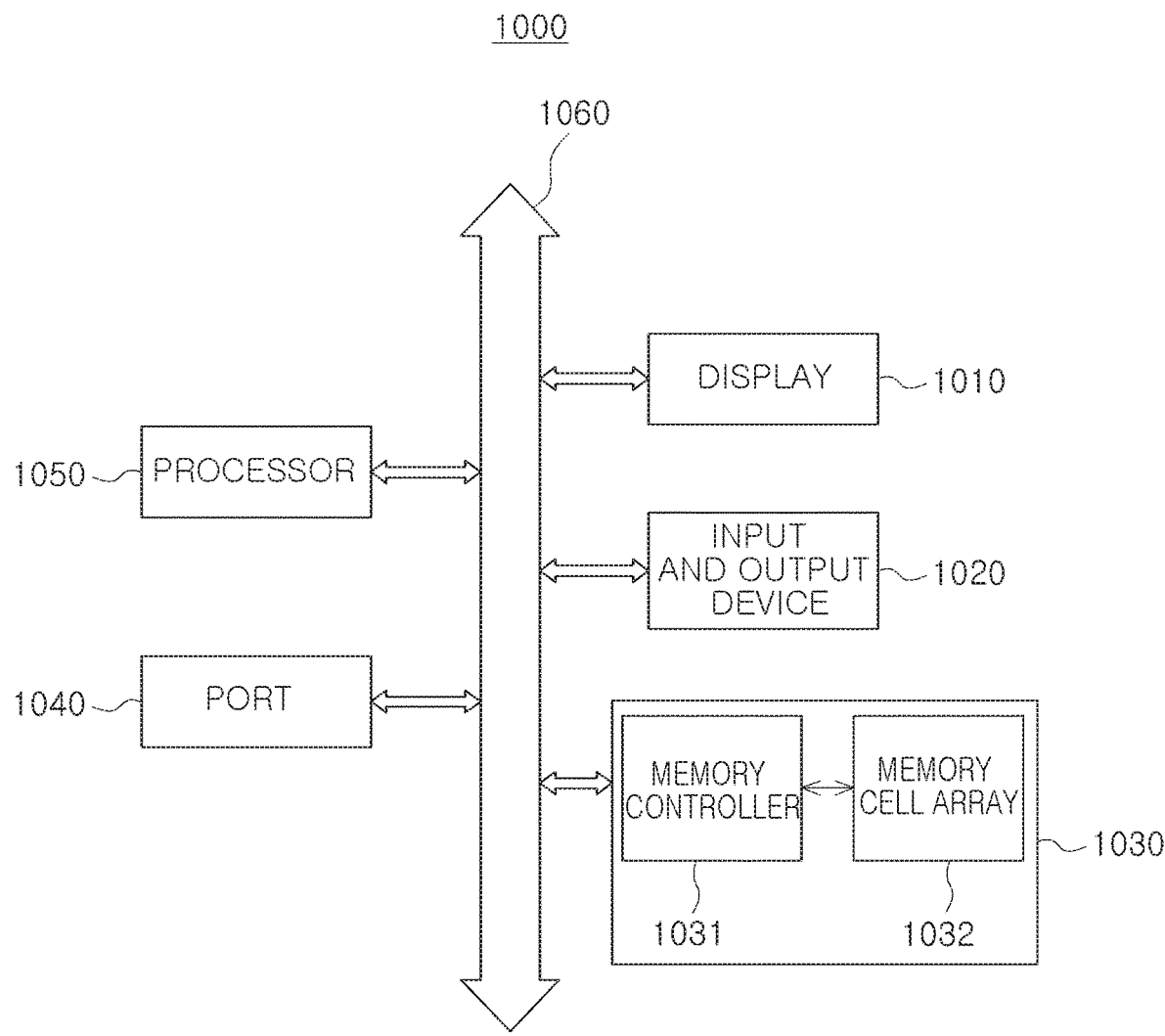
FIG. 17 is a schematic block diagram illustrating an electronic device including a memory device according to some example embodiments.

FIG. 17 is a schematic block diagram illustrating an electronic device including a memory device according to some example embodiments.

Referring to FIG. 17, an electronic device 1000 according to some example embodiments may include a display 1010, an input and output device 1020, a memory 1030, a port 1040, a processor 1050, and the like. The electronic device 1000 may include a television, a desktop computer, and the like, in addition to a mobile device such as a smartphone, a tablet PC, a laptop computer, and the like. The components such as the display 1010, the input and output device 1020, the memory 1030, the port 1040, the processor 1050, and the like, may communicate with each other through a bus 1060.

The memory 1030 may include a memory controller 1031 and a memory cell array 1032, and may perform an operation, such as a programming operation, a reading operation, an erasing operation, or the like, by receiving a command transmitted by the processor 1050 through the bus 1060. The memory 1030 may include a NAND flash memory device, and may include one of the memory devices according to various example embodiments illustrated with reference to FIGS. 1 to 16 previously.

As set forth above, according to some example embodiments of the present inventive concepts, when a controlling operation is performed on one of a plurality of memory areas, connected to a single bit line, a voltage, input to other memory areas, may vary according to whether each of other memory areas is programmed, and whether each of other memory areas shares a channel area with a memory area in which the controlling operation is performed, and the like. Thus, an effect of a controlling operation performed with respect to one of memory areas, connected to a single bit line, on other memory areas, is significantly reduced, so reliability of a memory device may be improved.

While example embodiments have been shown and described above, it will be apparent to those skilled in the art that modifications and variations could be made without departing from the scope of the present disclosure, as defined by the appended claims.

What is claimed is:

1. A memory device, comprising:
a first memory area having a plurality of first memory cells sharing a first channel area;
a second memory area having a plurality of second memory cells sharing the first channel area;
a third memory area having a plurality of third memory cells sharing a second channel area, the second channel area being different from the first channel area, the first channel area and the second channel area being connected to a same bit line; and
a controller configured to input a voltage to the second memory cells and to input a voltage to the third memory cells, when a controlling operation is performed on at least one of the first memory cells, the voltages for the second and third memory cells having different magnitudes.

2. The memory device of claim 1, wherein a magnitude of the voltage input to the second memory cells is greater magnitude than a magnitude of the voltage input to the third memory cells.

3. The memory device of claim 1, wherein the controlling operation includes at least one of a programming operation for storing data in at least one of the first memory cells and a reading operation for reading data from at least one of the first memory cells.

4. The memory device of claim 3, wherein the controller is further configured to
input a programming voltage to a selected memory cell of the first memory cells, and
input a pass voltage to remaining non-selected memory cells of the first memory cells to perform the programming operation, a magnitude of the pass voltage being less than a magnitude of the programming voltage.

5. The memory device of claim 4, wherein the controller is configured to input the pass voltage as the voltage input to the second memory cells, when the second memory area is programmed.

6. The memory device of claim 4, wherein the controller is configured to input a sub-pass voltage as the voltage input to the second memory cells, when the second memory area is not programmed, a magnitude of the sub-pass voltage being lower than the magnitude of the pass voltage.

7. The memory device of claim 6, wherein the controller is configured to discharge the sub-pass voltage for the second memory cells after discharging the pass voltage.

8. The memory device of claim 3, wherein the controller is configured to
input a reading voltage to a selected memory cell of the first memory cells, and
input a pass voltage to non-selected memory cells of the first memory cells, to perform the reading operation, a magnitude of the pass voltage being greater than a magnitude of the reading voltage.

9. The memory device of claim 8, wherein the controller is configured to input the pass voltage as the voltage input to the second memory cells, when the second memory area is programmed.

10. The memory device of claim 8, wherein the controller is configured to input a sub-pass voltage as the voltage input to the second memory cells, when the second memory area is not programmed, a magnitude of the sub-pass voltage being lower than the magnitude of the pass voltage.

11. The memory device of claim 10, wherein the controller is configured to discharge the sub-pass voltage input to the second memory cells after discharging the pass voltage.

12. The memory device of claim 1, wherein the third memory area includes a plurality of third memory sub-areas, and
the plurality of third memory sub-areas include a programmed third memory area and a non-programmed third memory area.

13. The memory device of claim 12, wherein the controller is configured to input one of a plurality of voltages to each of the third memory cells, the plurality of voltages input to the third memory cells including the voltage input to the third memory cells, and
a magnitude of a voltage input to the programmed third memory area by the controller is greater than a magnitude of a voltage input to the non-programmed third memory area by the controller.

14. A memory device, comprising:
a memory cell array including a first memory area and a second memory area, the first memory area including a plurality of first memory cells, the second memory area including a plurality of second memory cells, the first memory area and the second memory area being connected to a same bit line; and
a controller configured to
input an operating voltage to a selected memory cell among the plurality of first memory cells, and
input a pass voltage, different from the operating voltage, to remaining non-selected memory cells among the plurality of first memory cells, to perform a controlling operation on the first memory area,
wherein the controller is configured to determine a second voltage for second memory cells to be input to the plurality of second memory cells, based on at least one of whether the second memory area is programmed and whether the first memory area and the second memory area share a channel area.

15. The memory device of claim 14, wherein the controller is configured to determine to input a sub-pass voltage lower than the pass voltage as the voltage input to the plurality of second memory cells, when the second memory area shares the channel area with the first memory area, and the second memory area is not programmed.

16. The memory device of claim 14, wherein the controller is configured to input the pass voltage as the voltage input to the second memory cells, when the second memory area shares the channel area with the first memory area and the second memory area is programmed.

17. The memory device of claim 14, wherein the controller is configured to input a sub-pass voltage lower than the pass voltage, as the voltage input to the second memory cells, when the second memory area does not share the channel area with the first memory area.

18. The memory device of claim 14, wherein the controller is configured to determine a magnitude and a discharge time of the second voltage input to the second memory cells to be input to the plurality of second memory cells, based on at least one of whether the second memory area is programmed and whether the first memory area and the second memory area share the channel area.

19. The memory device of claim 14, wherein the controller is configured to determine that the second memory area is programmed, when data is stored in one or more among the plurality of second memory cells.

20. A memory device, comprising:
a memory cell array including a first memory area, a second memory area, and a third memory area, the second memory area configured to store data and being different from the first memory area, and the third memory area is not configured to store the data and being different from the first memory area and the second memory area, the first memory area, the second memory area, and the third memory area being connected to a bit line; and
a controller configured to
when a plurality of first voltages are input to the first memory area to perform a controlling operation for the first memory area, input a second voltage to the second memory area and input a third voltage to the third memory area, and
discharge the second voltage and the third voltage differently, when the controlling operation is terminated.

* * * * *